US008716720B2

(12) United States Patent
Takeuchi et al.

(10) Patent No.: US 8,716,720 B2
(45) Date of Patent: May 6, 2014

(54) METHOD FOR MANUFACTURING PHOTOCOUPLER, AND PHOTOCOUPLER LEAD FRAME SHEET

(75) Inventors: Teruo Takeuchi, Fukuoka-ken (JP); Atsushi Takeshita, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/475,704

(22) Filed: May 18, 2012

(65) Prior Publication Data

US 2013/0153932 A1  Jun. 20, 2013

(30) Foreign Application Priority Data

Dec. 16, 2011  (JP) ................................ 2011-276136

(51) Int. Cl.
*H01L 33/62* (2010.01)
(52) U.S. Cl.
USPC ............................................. 257/81; 438/25
(58) Field of Classification Search
CPC ............ H01L 23/495; H01L 23/49537; H01L 23/49544; H01L 23/49575; H01L 23/49861; H01L 33/62
USPC ................... 257/81, 88, 89, 666–667
See application file for complete search history.

(56) References Cited

U.S. PATENT DOCUMENTS

| 4,446,375 | A | * | 5/1984 | Aird ............................. 250/551 |
| 5,321,305 | A | * | 6/1994 | Sakamoto ..................... 257/666 |
| 6,107,676 | A | * | 8/2000 | Suzuki ......................... 257/666 |
| 7,547,960 | B2 | | 6/2009 | Lee et al. |
| 7,666,710 | B2 | | 2/2010 | Lee et al. |
| 7,688,599 | B2 | * | 3/2010 | Su ................................. 361/813 |
| 7,843,043 | B2 | | 11/2010 | Lee et al. |
| 8,168,989 | B2 | * | 5/2012 | Isobe ............................ 257/88 |
| 2011/0062565 | A1 | * | 3/2011 | Hesen et al. .................. 257/666 |
| 2011/0074749 | A1 | * | 3/2011 | Higashi ........................ 345/206 |
| 2011/0096045 | A1 | * | 4/2011 | Ito et al. ....................... 345/204 |

* cited by examiner

*Primary Examiner* — Nathan Ha
(74) *Attorney, Agent, or Firm* — Patterson & Sheridan, LLP

(57) ABSTRACT

A method for manufacturing a photocoupler includes: mounting light emitting devices and light receiving devices on a lead frame sheet; positioning the lead frame sheet with respect to a die by cutting off the one set of column portions from a linking portion and inserting a first pilot pin formed on the die into a second pilot hole; opposing the light emitting devices and the light receiving devices to each other; connecting the light emitting side coupling bars and the light receiving side coupling bars to each other on the die; forming a resin body so as to cover a pair of the light emitting device and the light receiving device; and cutting off the light emitting side lead frame portion from the light emitting column portion and cutting off the light receiving side lead frame portion from the light receiving column portion.

17 Claims, 18 Drawing Sheets

PILOT HOLES: NOT USED

PILOT HOLES: USED

COUPLING BARS: 2

COUPLING BARS: 3

METHOD FOR MANUFACTURING PHOTOCOUPLER, AND PHOTOCOUPLER LEAD FRAME SHEET

CROSS-REFERENCE TO RELATED APPLICATIONS

This application is based upon and claims the benefit of priority from the prior Japanese Patent Application No. 2011-276136, filed on Dec. 16, 2011; the entire contents of which are incorporated herein by reference.

FIELD

Embodiments described herein relate generally to a method for manufacturing photocoupler, and a photocoupler lead frame sheet.

BACKGROUND

Conventionally, in manufacturing an opposed photocoupler, two lead frame sheets have been used. The two lead frame sheets are a light emitting device side lead frame sheet and a light receiving device side lead frame sheet. In the light emitting device side lead frame sheet, a plurality of light emitting side lead frames are formed. In the light receiving device side lead frame sheet, a plurality of light receiving side lead frames are formed. However, it is desired to increase the utilization efficiency of the material of the lead frame sheet, and to reduce the fabrication cost of the lead frame sheet. To this end, there has recently been proposed a technique for forming both of light emitting side lead frames and light receiving side lead frames in one lead frame sheet. This technique requires cutting off e.g. a light emitting side lead frame from the lead frame sheet and then opposing it to a light receiving side lead frame remaining in the lead frame sheet. However, it is difficult to accurately position the light emitting side lead frame and the light receiving side lead frame.

BRIEF DESCRIPTION OF THE DRAWINGS

FIGS. 9A and 9B illustrate the method for manufacturing a photocoupler according to the first embodiment, wherein FIG. 9A shows a state before rotating a light emitting column portion, and FIG. 9B shows a state after rotating the light emitting column portion;

DETAILED DESCRIPTION

Figure 1:
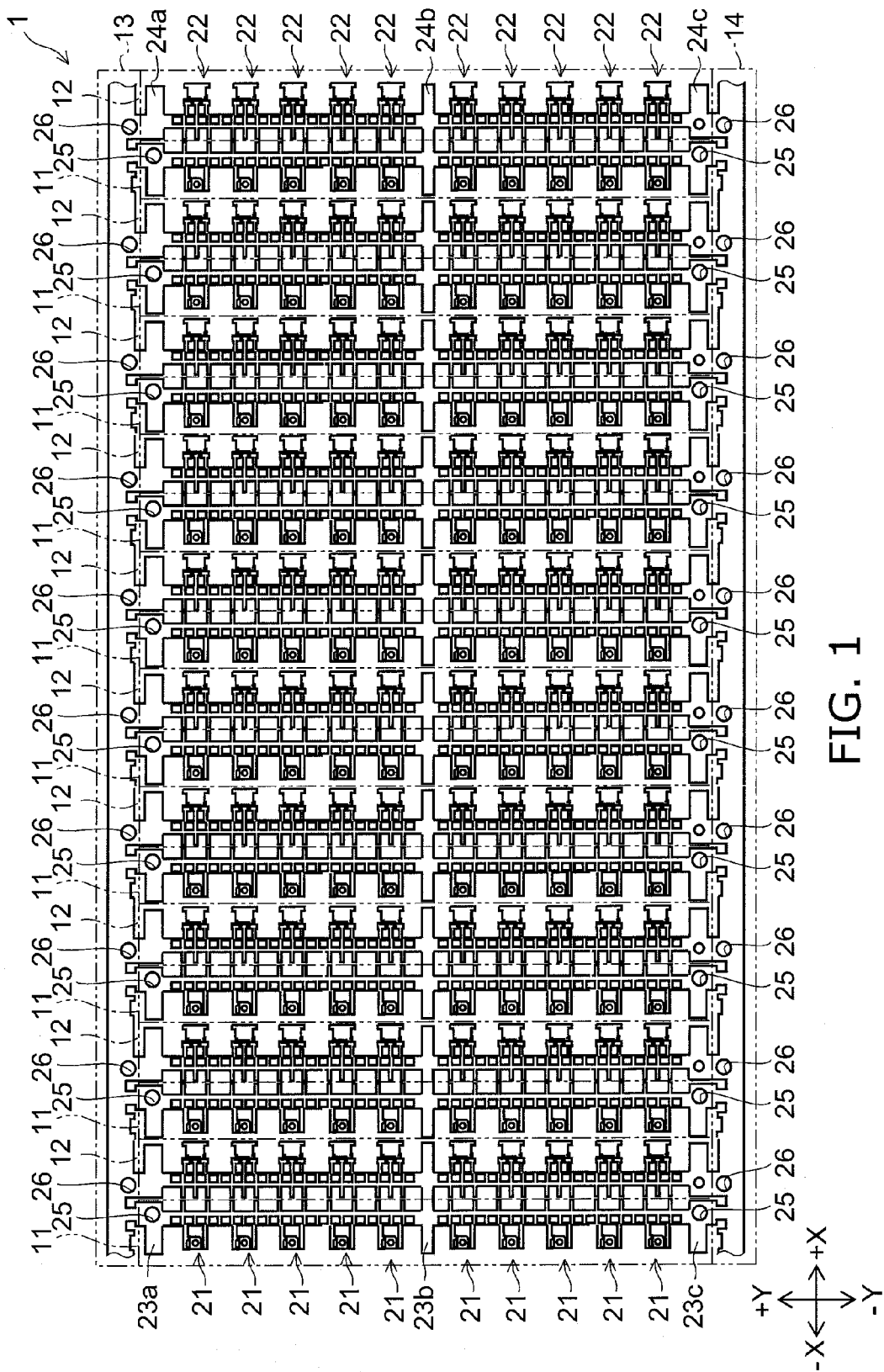
FIG. 1 is a plan view illustrating a photocoupler lead frame sheet according to a first embodiment.

In general, according to one embodiment, a method for manufacturing a photocoupler includes: mounting light emitting devices and light receiving devices on a lead frame sheet in which a plurality of light emitting column portions and a plurality of light receiving column portions are alternately arranged, the light emitting column portion including a plurality of light emitting side lead frame portions arranged in a line, the light emitting column portion being provided with three or more light emitting side coupling bars, the light receiving column portion including a plurality of light receiving side lead frame portions arranged in a line, the light receiving column portion being provided with three or more light receiving side coupling bars, one end of the light emitting column portions and one end of the light receiving column portions being interlinked by a linking portion, a first pilot hole being formed in each of one set of column portions of the light emitting column portions and the light receiving column portions, a second pilot hole being formed in a portion except the one set of column portions, the light emitting device being mounted on the light emitting side lead frame portion, and the light receiving device being mounted on the light receiving side lead frame portion; positioning the lead frame sheet with respect to a die by cutting off the one set of column portions from the linking portion and inserting a first pilot pin formed on the die into the second pilot hole; positioning the one set of column portions with respect to the die and opposing the light emitting devices and the light receiving devices to each other by inserting a second pilot pin formed on the die into the first pilot hole and stacking the light emitting side coupling bars and the light receiving side coupling bars; connecting the light emitting side coupling bars and the light receiving side coupling bars to each other on the die; forming a resin body so as to cover a pair of the light emitting device and the light receiving device; and cutting off the light emitting side lead frame portion from the light emitting column portion and cutting off the light receiving side lead frame portion from the light receiving column portion.

In general, according to one embodiment, a photocoupler lead frame sheet includes: a plurality of light emitting column portions and light receiving column portions arranged alternately; and a linking portion interlinking one end of the light emitting column portions and one end of the light receiving column portions, the light emitting column portion including: a plurality of light emitting side lead frame portions arranged in a line; and three or more light emitting side coupling bars, the light receiving column portion including: a plurality of light receiving side lead frame portions arranged in a line; and three or more light receiving side coupling bars, a first pilot hole being formed in one column portion of the light emitting column portion and the light receiving column portion, and a second pilot hole being formed in a portion except the one column portion.

Embodiments of the invention will now be described with reference to the drawings.

First, a first embodiment is described.

In the following, a photocoupler lead frame sheet according to this embodiment is described.

FIG. 1 is a plan view illustrating the photocoupler lead frame sheet according to this embodiment.

Figure 2:
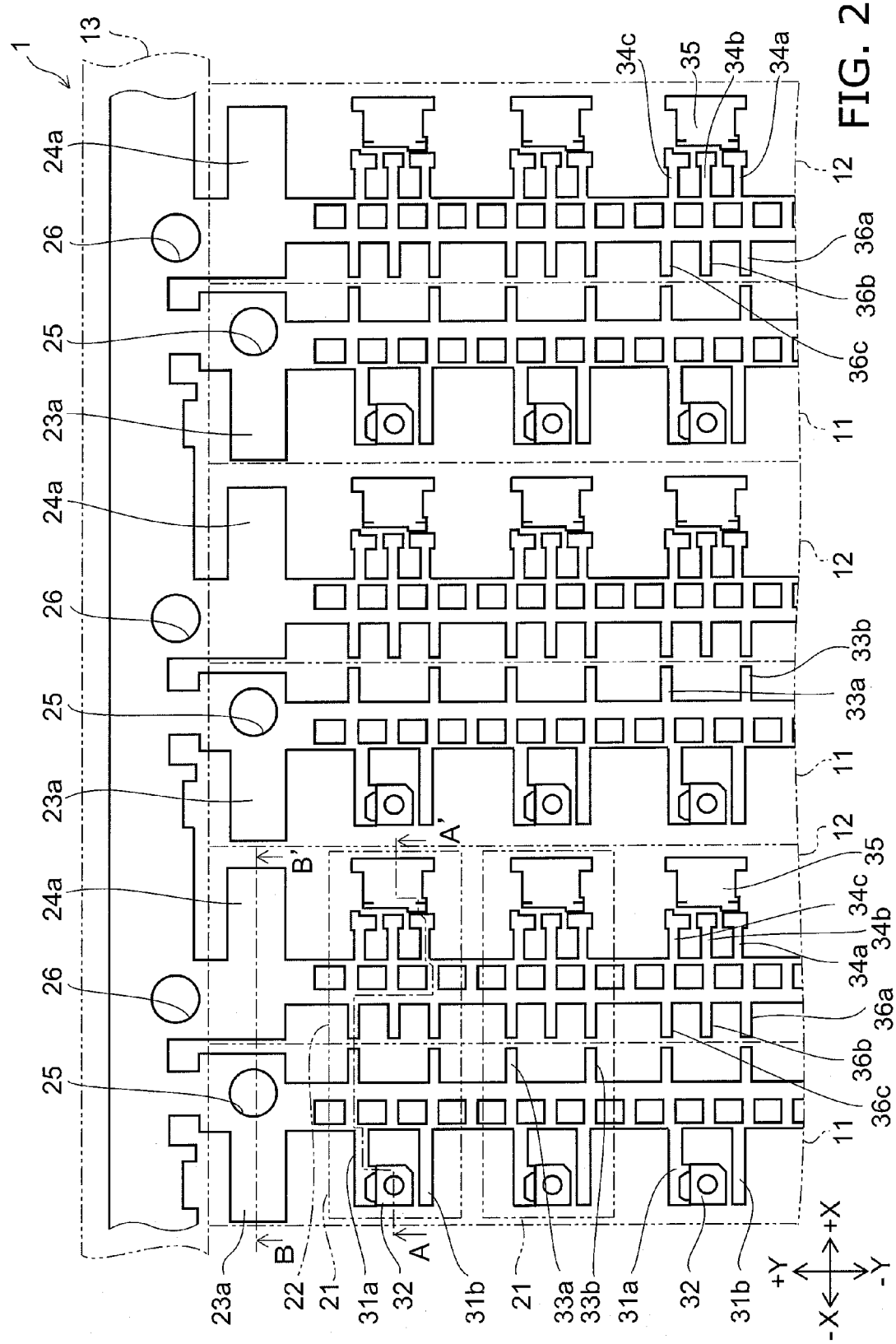
FIG. 2 is an enlarged view of FIG. 1.

FIG. 2 is an enlarged view of FIG. 1.

Figure 3A:
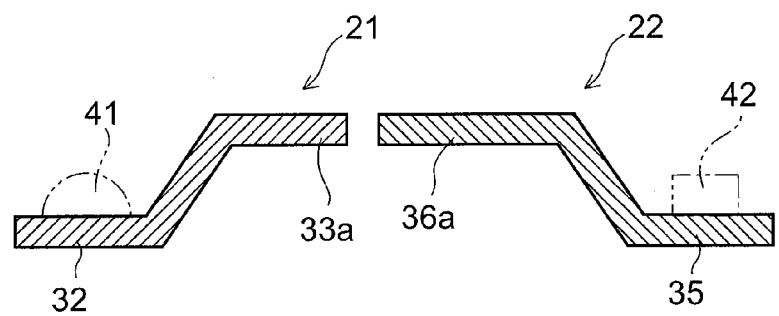
FIG. 3A is a sectional view taken along line A-A' shown in FIG. 2.
Figure 3B:
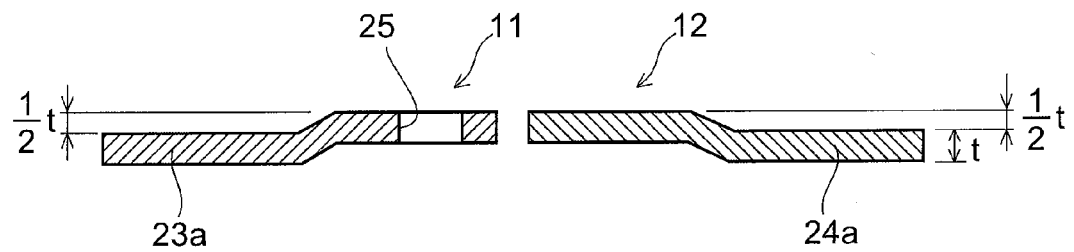
FIG. 3B is a sectional view taken along line B-B' shown in FIG. 2.

FIG. 3A is a sectional view taken along line A-A' shown in FIG. 2. FIG. 3B is a sectional view taken along line B-B' shown in FIG. 2.

In the photocoupler lead frame sheet 1 (hereinafter also simply referred to as "sheet 1") shown in FIG. 1, a plurality of (e.g., 10) light emitting column portions 11 and a plurality of (e.g., 10) light receiving column portions 12 are alternately arranged. One end of all the light emitting column portions 11 and one end of all the light receiving column portions 12 are interlinked by a linking portion 13. The other end of all the light emitting column portions 11 and the other end of all the light receiving column portions 12 are interlinked by a linking portion 14. The linking portions 13 and 14 may be part of a frame-shaped member.

In the following, for convenience of description, the arranging direction of the light emitting column portions 11 and the light receiving column portions 12 is referred to as "X direction". The extending direction of the light emitting column portions 11 and the light receiving column portions 12 is referred to as "Y direction". This means that the linking portions 13 and 14 extend in the X direction. Furthermore, of the two X-direction end portions of the sheet 1, the direction toward the side where the light emitting column portion 11 is placed in the outermost portion is referred to as "−X direction". The direction toward the side where the light receiving column portion 12 is placed in the outermost portion is referred to as "+X direction". Furthermore, the linking portion 13 side is referred to as "+Y direction". The linking portion 14 side is referred to as "−Y direction". Moreover, the direction orthogonal to both the X direction and the Y direction is referred to as "Z direction". The side where the light emitting device and the light receiving device described later are mounted is referred to as "+Z direction", and the opposite side is referred to as "−Z direction".

In the sheet 1, all the light emitting column portions 11, all the light receiving column portions 12, the linking portion 13, and the linking portion 14 are integrally formed. For instance, the sheet 1 is fabricated by processing one metal plate. For instance, the metal plate is selectively removed by punching, and locally bent in the sheet thickness direction. The sheet 1 has e.g. a Ni/Pd/Au-PPF (palladium pre-plated lead frame) structure. In this structure, the surface of a copper plate is covered with a plating layer in which a nickel layer, a palladium layer, and a gold layer are stacked in this order. The thickness of the sheet 1 is e.g. 0.07 mm or more and 0.25 mm or less.

Each light emitting column portion 11 includes a plurality of (e.g., 10) light emitting side lead frame portions 21 arranged in a line along the Y direction. Each light receiving column portion 12 includes a plurality of (e.g., 10) light receiving side lead frame portions 22 arranged in a line along the Y direction. The arrangement pitch and phase of the light emitting side lead frame portions 21 in each light emitting column portion 11 are equal, respectively, to the arrangement pitch and phase of the light receiving side lead frame portions 22 in each light receiving column portion 12. The light emitting side lead frame portions 21 are interlinked by part of the sheet 1. The light receiving side lead frame portions 22 are interlinked by part of the sheet 1.

Each light emitting column portion 11 includes three light emitting side coupling bars 23a, 23b, and 23c. Each light emitting side coupling bar is shaped like a strip and extends out from the light emitting column portion 11 to the −X direction. The light emitting side coupling bar 23a is placed in the +Y-direction end portion of the light emitting column portion 11. The light emitting side coupling bar 23b is placed in the Y-direction center portion of the light emitting column portion 11. The light emitting side coupling bar 23c is placed in the −Y-direction end portion of the light emitting column portion 11.

Likewise, each light receiving column portion 12 includes three light receiving side coupling bars 24a, 24b, and 24c. Each light receiving side coupling bar is shaped like a strip and extends out from the light receiving column portion 12 to the +X direction. The light receiving side coupling bar 24a is placed in the +Y-direction end portion of the light receiving column portion 12. The light receiving side coupling bar 24b is placed in the Y-direction center portion of the light receiving column portion 12. The light receiving side coupling bar 24c is placed in the −Y-direction end portion of the light receiving column portion 12. The positions in the Y direction of the light receiving side coupling bars 24a, 24b, and 24c are identical to the positions in the Y direction of the light emitting side coupling bars 23a, 23b, and 23c, respectively.

As shown in FIGS. 1 and 2, in each light emitting column portion 11, two pilot holes 25 are formed. The pilot holes 25 are formed in e.g. the root portion of the lead 23a and the root portion of the lead 23c in the light emitting column portion 11. Furthermore, in the portion of the sheet 1 except the light emitting column portion 11, a plurality of (e.g., 20) pilot holes 26 are formed. The pilot holes 26 are placed in e.g. the regions of the linking portion 13 and the linking portion 14 located in the Y direction as viewed from each light receiving column portion 12. The pilot holes 25 and 26 penetrate through the sheet 1. As viewed in the thickness direction of the sheet 1, each of the pilot holes 25 and 26 is shaped like e.g. a circle.

As shown in FIG. 2, each light emitting side lead frame portion 21 includes a pair of leads 31a and 31b, a light emitting device mounting portion 32, and a pair of leads 33a and 33b. These members are integrally formed. The leads 31a and 31b are extracted to the −X direction side. The lead 31a is placed on the +Y direction side of the lead 31b. The leads 31a and 31b are spaced from each other. The light emitting device mounting portion 32 is a member like a rectangular plate, and is attached to the tip of the lead 31a. The light emitting device mounting portion 32 is a portion where a light emitting device (see FIG. 3A) is mounted. The light emitting device mounting portion 32 supports the light emitting device 41. To the light emitting device mounting portion 32, one terminal of the light emitting device 41 is connected via e.g. conductive paste. On the other hand, to the lead 31b, the other terminal of the light emitting device 41 is connected via a wire. The leads 33a and 33b are extracted to the +X direction side. The lead 33a is placed on the +Y direction side of the lead 33b. The leads 33a and 33b are spaced from each other.

Likewise, each light receiving side lead frame portion 22 includes three leads 34a-34c, a light receiving device mounting portion 35, and three leads 36a-36c. These members are integrally formed. The leads 34a-34c are extracted to the +X direction side. The leads 34a-34c are placed sequentially from the −Y direction side and spaced from each other. The light receiving device mounting portion 35 is a member like a rectangular plate, and is attached to the tip of the lead 34a. The light receiving device mounting portion 35 is a portion where a light receiving device 42 (see FIG. 3A) is mounted. The light receiving device mounting portion 35 supports the light receiving device 42. To the light receiving device mounting portion 35, one terminal of the light receiving device 42 is connected via e.g. conductive paste. On the other hand, to the leads 34b and 34c, the other terminals of the light receiving device 42 are connected via wires. The leads 36a-36c are extracted to the −X direction side. The leads 36a-36c are placed sequentially from the −Y direction side and spaced from each other.

The leads 33a and 33c of the light emitting side lead frame portion 21 are identical in position in the Y direction to the leads 36a and 36c of the light receiving side lead frame portion 22, respectively. The tip portions of the leads 33a and 33c and the tip portions of the leads 36a and 36c are opposed to and spaced from each other. The tip portion of the light emitting device mounting portion 32 of the light emitting side lead frame portion 21 and the tip portion of the light receiving device mounting portion 35 of the light receiving side lead frame portion 22 are also opposed to and spaced from each other. Hence, the light emitting column portion 11 and the light receiving column portion 12 are not in contact with each other, although linked via the linking portions 13 and 14.

As shown in FIG. 3A, the leads 33a and 33b of the light emitting side lead frame portion 21 and the leads 36a-36c of the light receiving side lead frame portion 22 are placed coplanarly. The light emitting device mounting portion 32 is displaced downward from the leads 33a and 33b. Likewise, the light receiving device mounting portion 35 is displaced downward from the leads 36a-36c.

As shown in FIG. 3B, the light emitting side coupling bars 23a-23c and the light receiving side coupling bars 24a-24c are displaced downward by a half distance (t/2) of the thickness t of the sheet 1 from the leads 33a and 33b and the leads 36a-36c.

Next, a method for using the photocoupler lead frame sheet 1 according to this embodiment, i.e., a method for manufacturing a photocoupler according to this embodiment, is described.

Figure 4:
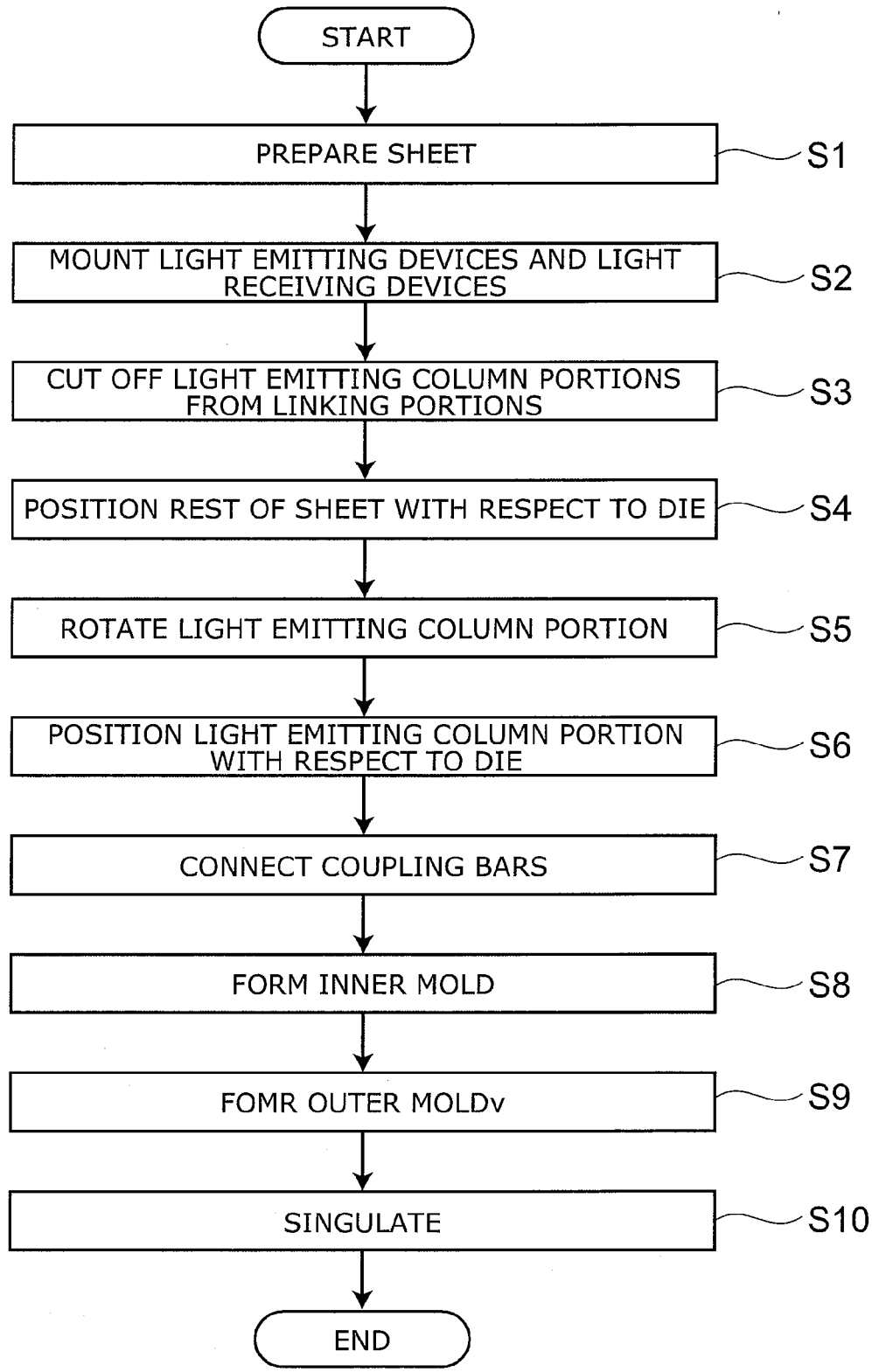
FIG. 4 is a flow chart illustrating a method for manufacturing a photocoupler according to the first embodiment.

FIG. 4 is a flow chart illustrating the method for manufacturing a photocoupler according to this embodiment.

Figure 5A:
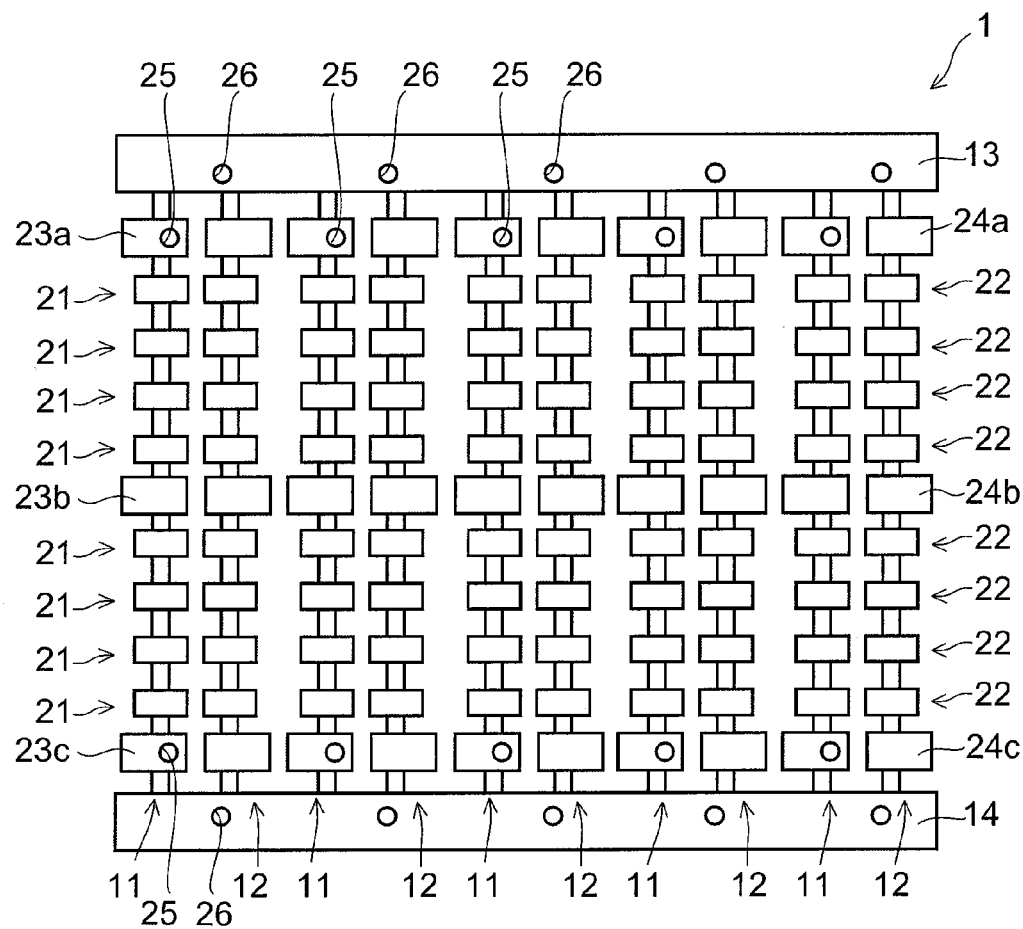
FIG. 5A is a plan view illustrating the method for manufacturing the photocoupler according to the first embodiment.
Figure 5A:
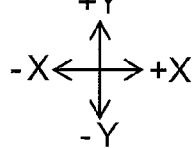
Figure 5B:
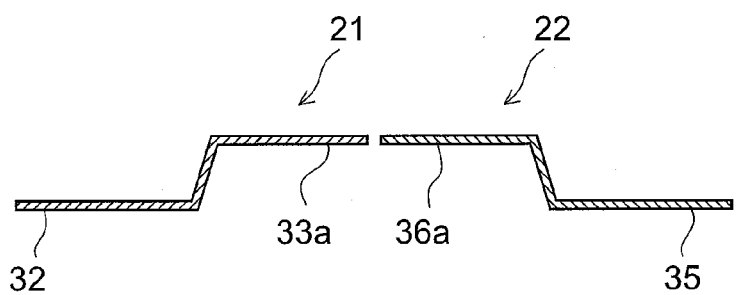
FIG. 5B is a partial sectional view thereof.
Figure 5B:
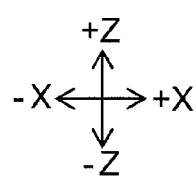

FIG. 5A is a plan view illustrating the method for manufacturing a photocoupler according to this embodiment. FIG. 5B is a partial sectional view thereof.

Figure 6A:
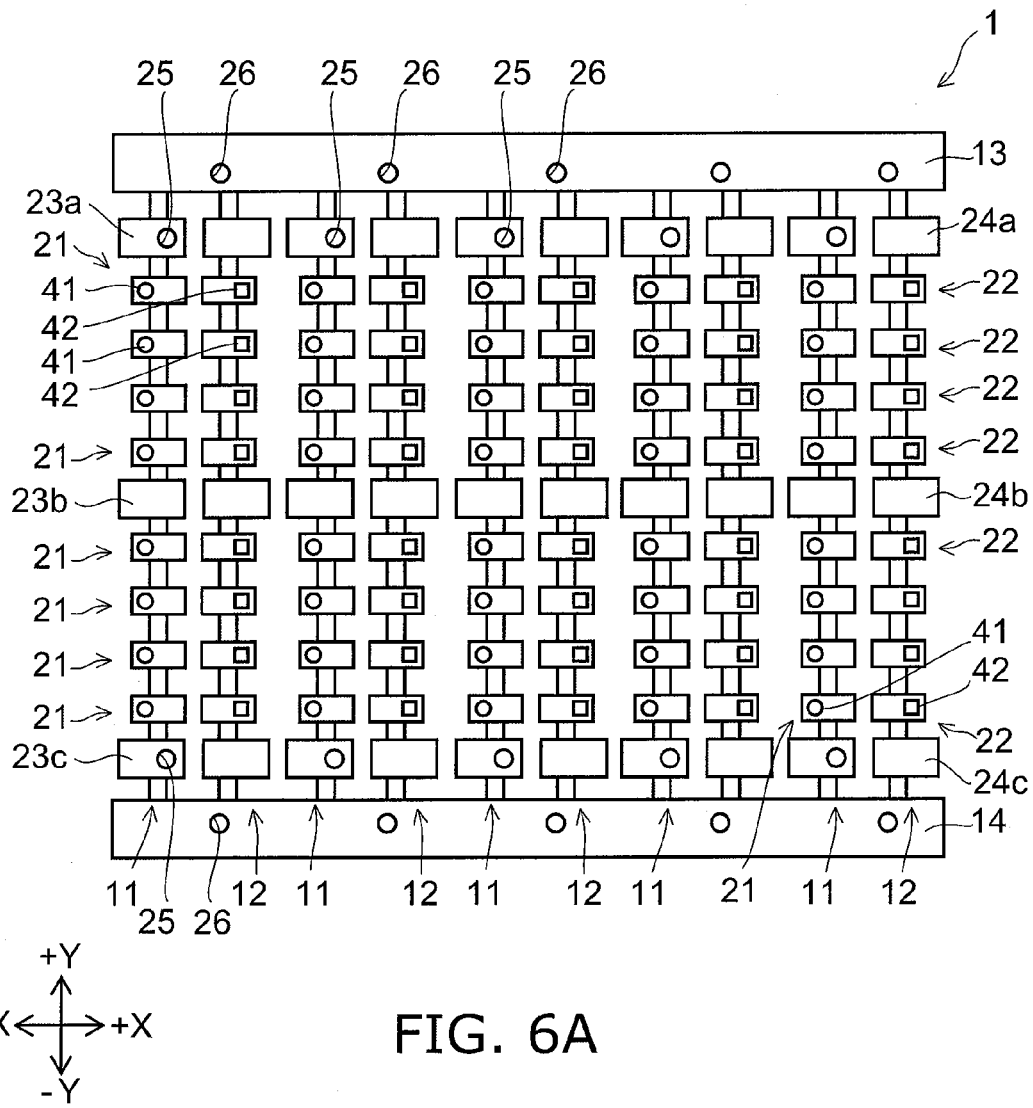
FIG. 6A is a plan view illustrating the method for manufacturing the photocoupler according to the first embodiment.
Figure 6B:
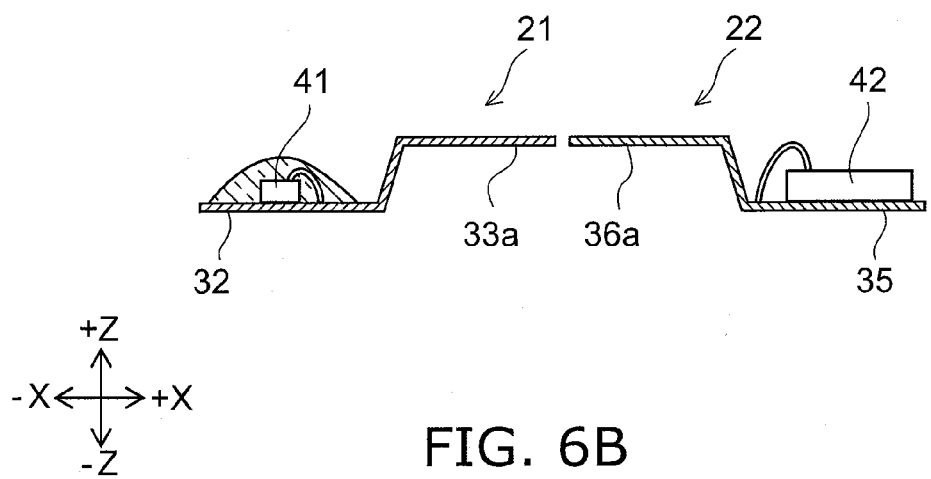
FIG. 6B is a partial sectional view thereof.

FIG. 6A is a plan view illustrating the method for manufacturing a photocoupler according to this embodiment. FIG. 6B is a partial sectional view thereof.

Figure 7:
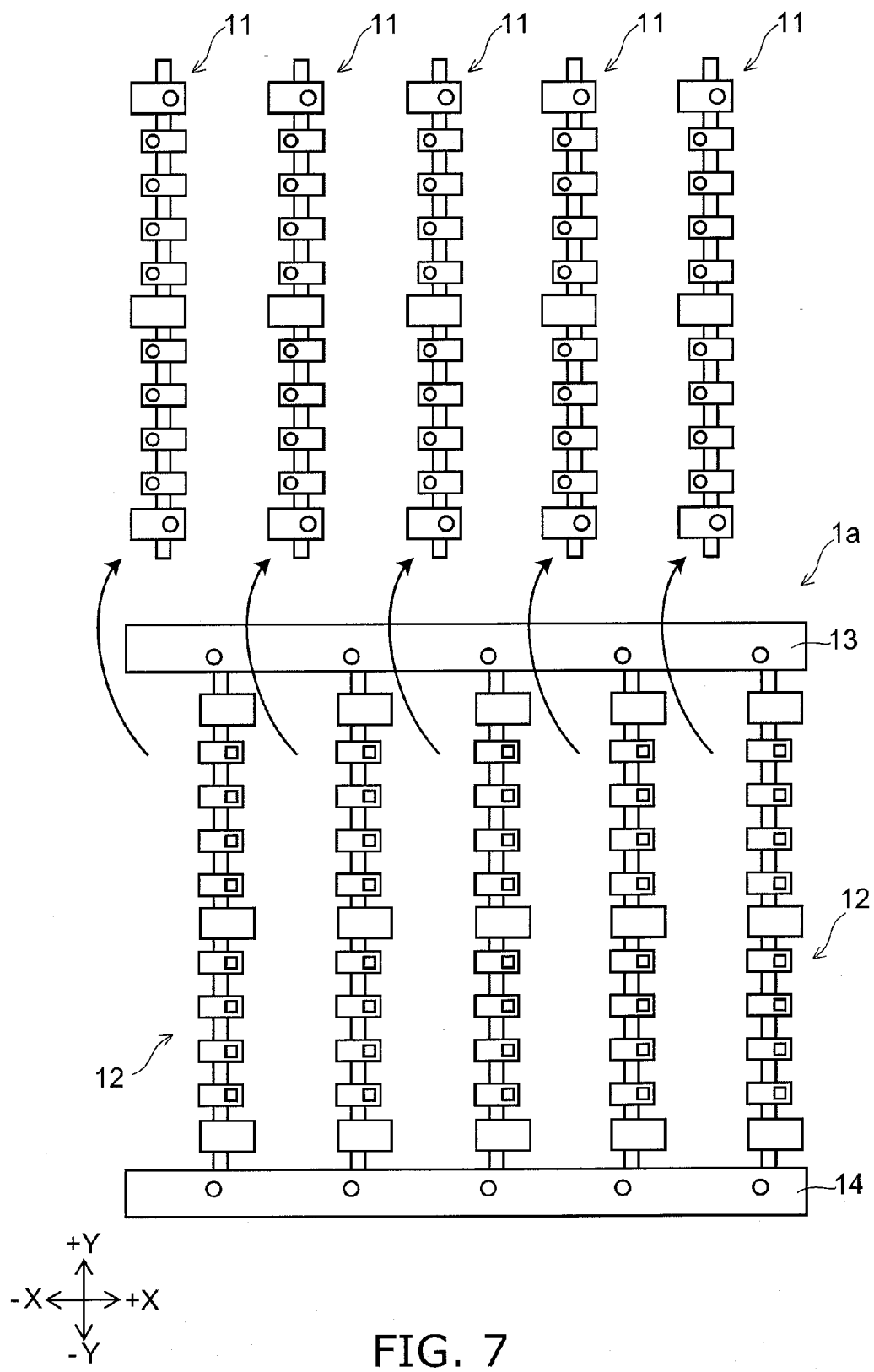
FIG. 7 is a plan view illustrating the method for manufacturing the photocoupler according to the first embodiment.

FIG. 7 is a plan view illustrating the method for manufacturing a photocoupler according to this embodiment.

Figure 8A:
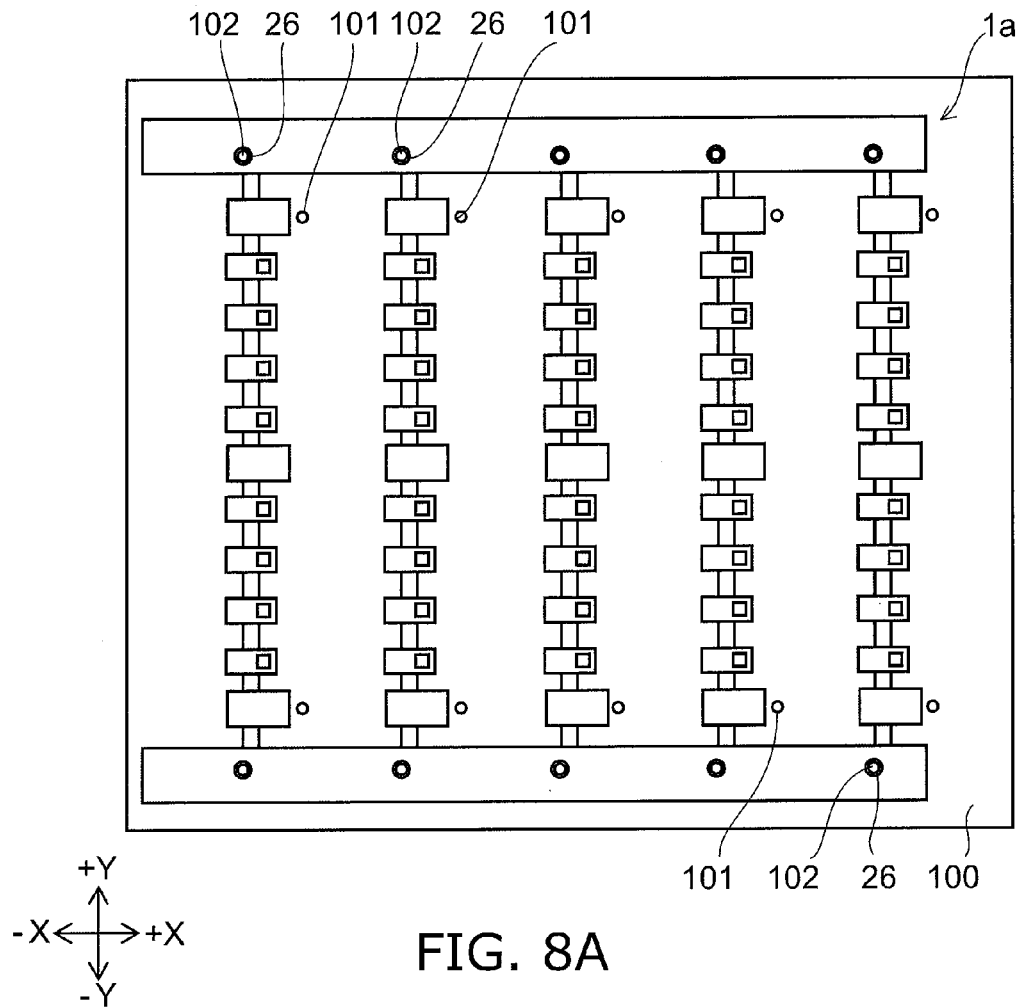
FIG. 8A is a plan view illustrating the method for manufacturing the photocoupler according to the first embodiment.
Figure 8B:
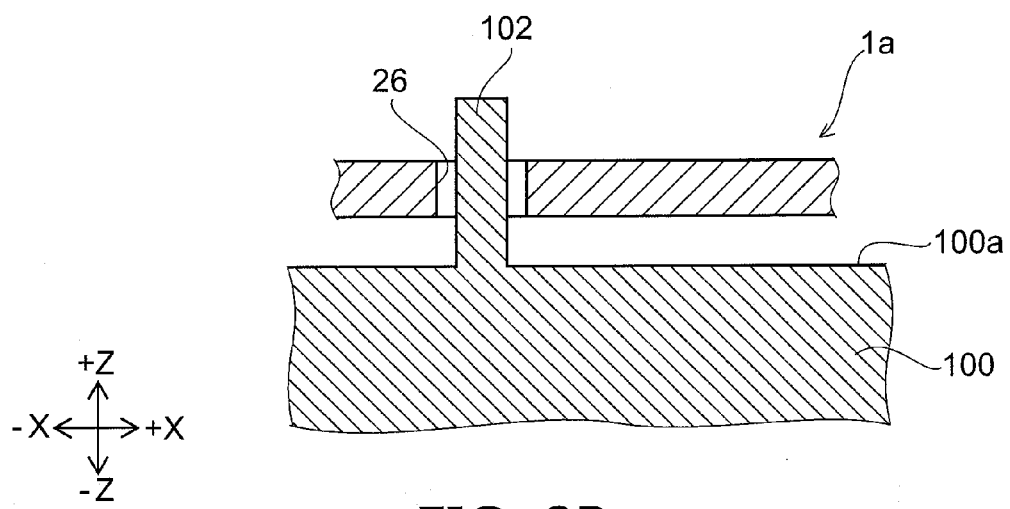
FIG. 8B is a partial sectional view thereof.

FIG. 8A is a plan view illustrating the method for manufacturing a photocoupler according to this embodiment. FIG. 8B is a partial sectional view thereof.

Figure 9A:
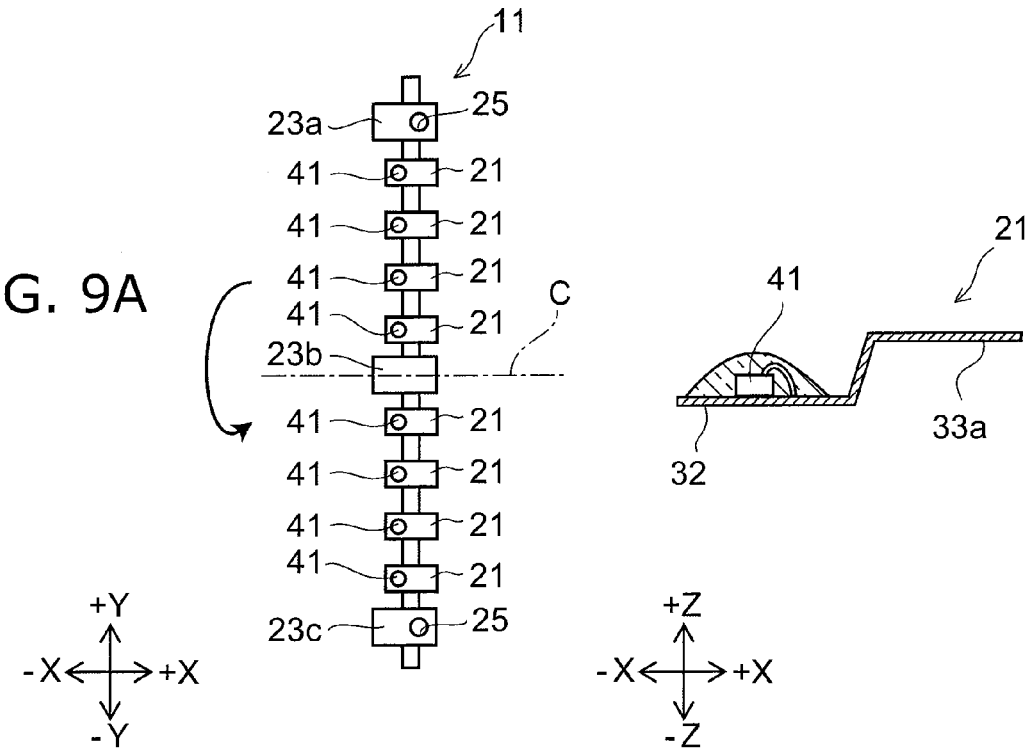
Figure 9B:
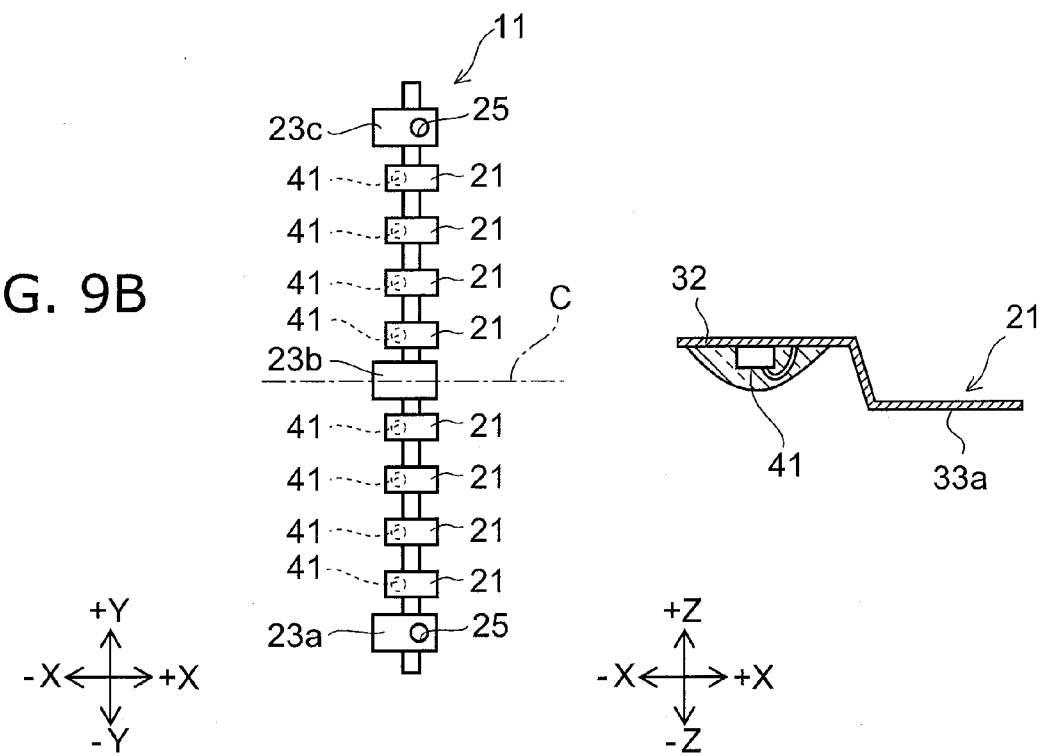

FIGS. 9A and 9B illustrate the method for manufacturing a photocoupler according to this embodiment. FIG. 9A shows the state before rotating the light emitting column portion. FIG. 9B shows the state after rotating the light emitting column portion.

Figure 10A:
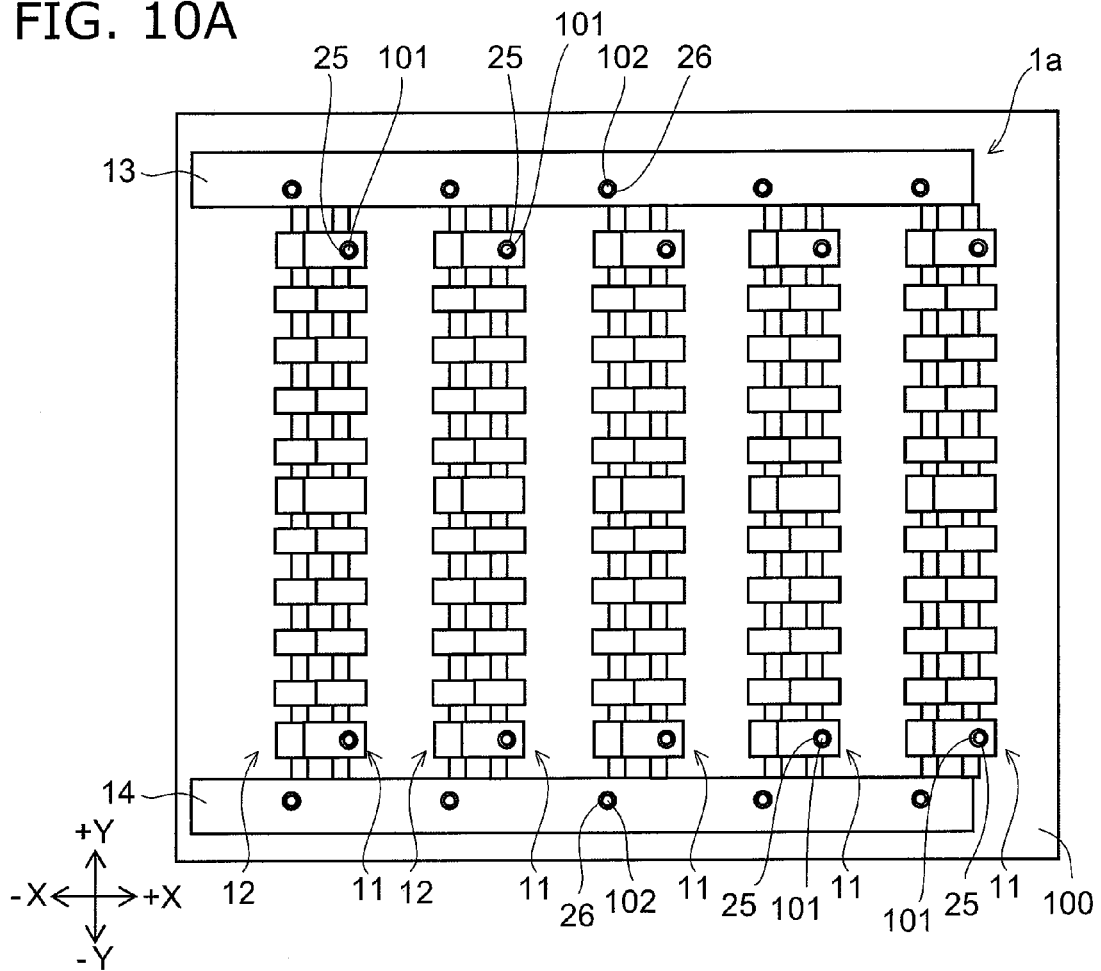
FIG. 10A is a plan view illustrating the method for manufacturing the photocoupler according to the first embodiment.
Figure 10B:
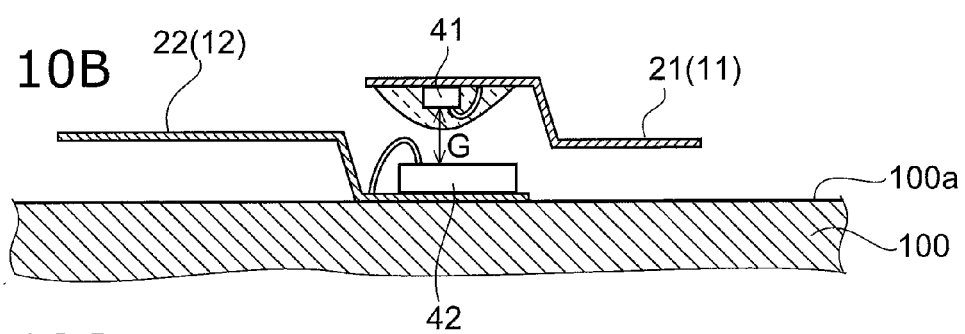
FIGS. 10B and 10C are partial sectional views thereof.
Figure 10C:
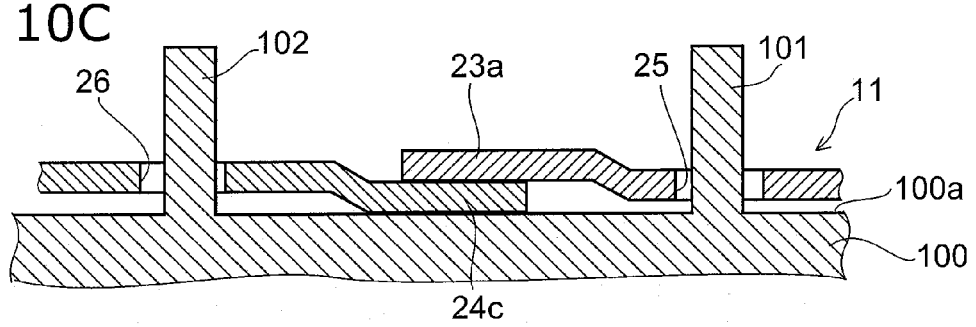

FIG. 10A is a plan view illustrating the method for manufacturing a photocoupler according to this embodiment. FIGS. 10B and 10C are partial sectional views thereof.

Figure 11A:
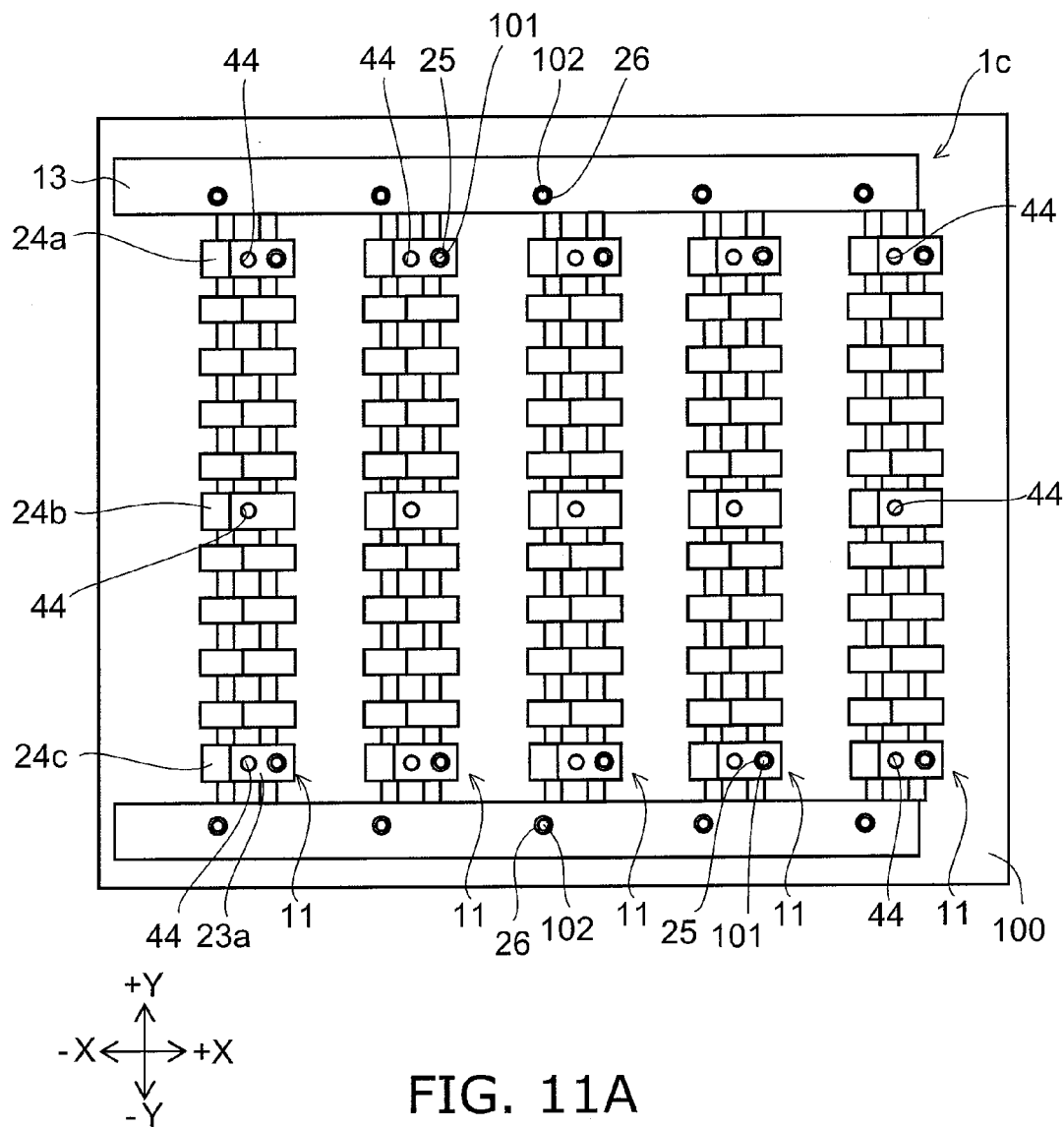
FIG. 11A is a plan view illustrating the method for manufacturing the photocoupler according to the first embodiment.
Figure 11B:
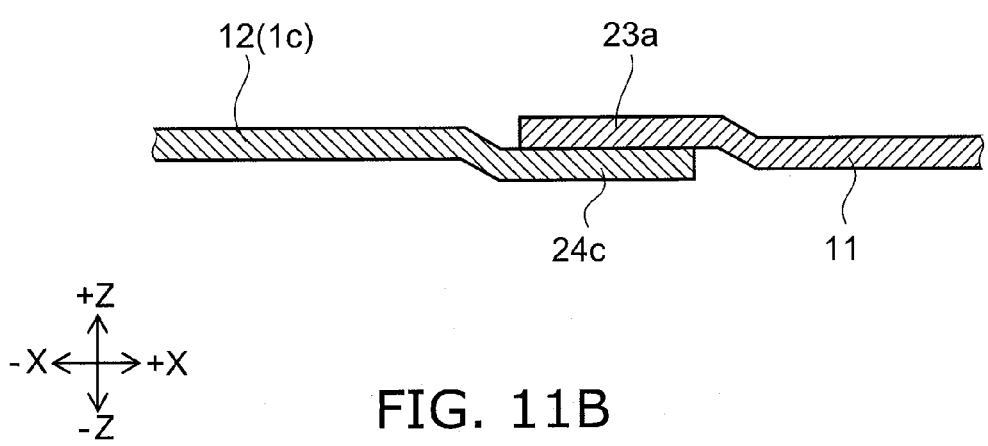
FIG. 11B is a partial sectional view thereof.

FIG. 11A is a plan view illustrating the method for manufacturing a photocoupler according to this embodiment. FIG. 11B is a partial sectional view thereof.

Figure 12A:
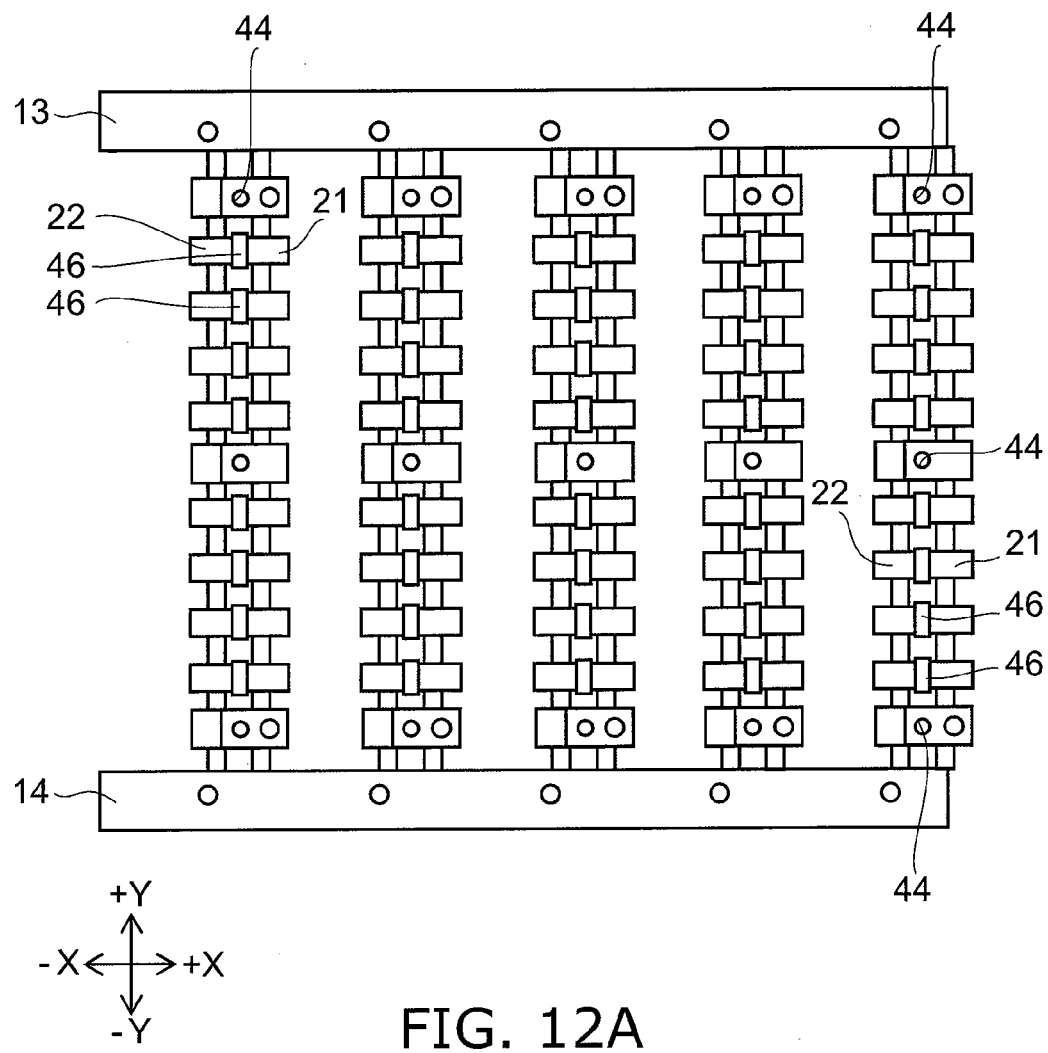
FIG. 12A is a plan view illustrating the method for manufacturing the photocoupler according to the first embodiment.
Figure 12B:
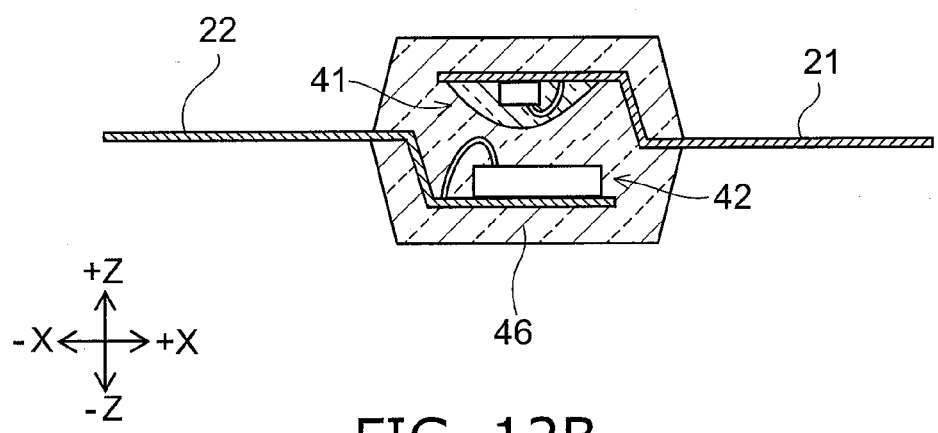
FIG. 12B is a partial sectional view thereof.

FIG. 12A is a plan view illustrating the method for manufacturing a photocoupler according to this embodiment. FIG. 12B is a partial sectional view thereof.

Figure 13A:
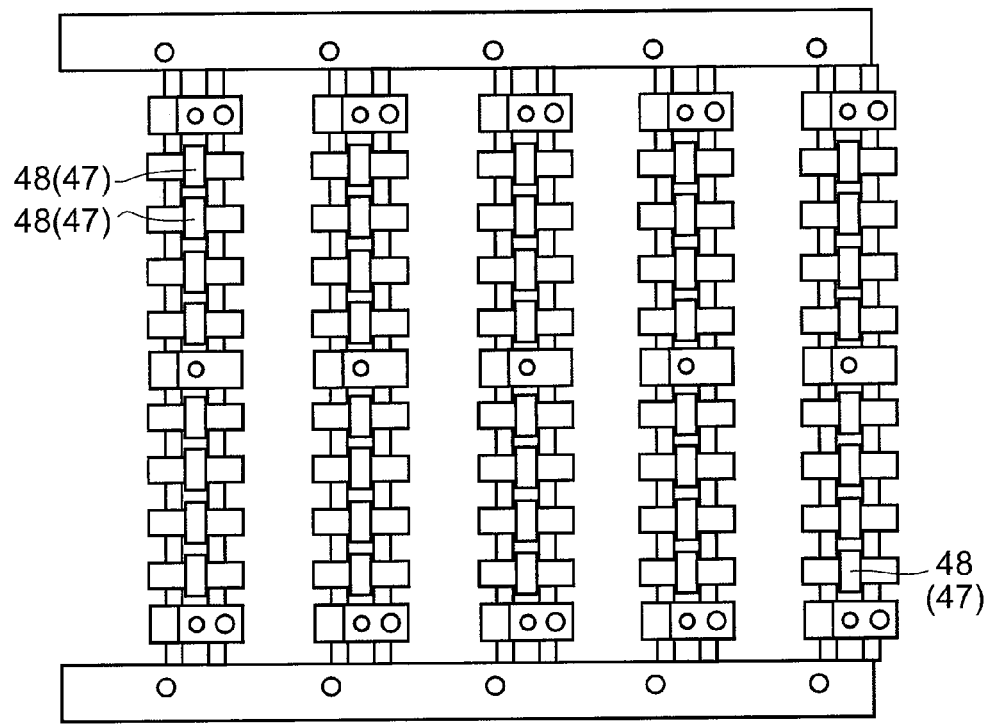
FIG. 13A is a plan view illustrating the method for manufacturing the photocoupler according to the first embodiment.
Figure 13B:
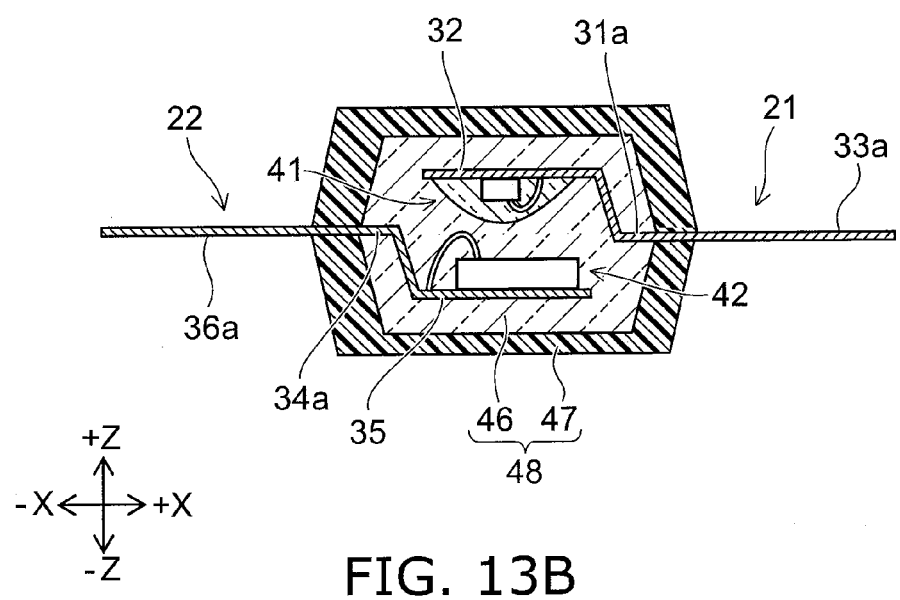
FIG. 13B is a partial sectional view thereof.

FIG. 13A is a plan view illustrating the method for manufacturing a photocoupler according to this embodiment. FIG. 13B is a partial sectional view thereof.

Figure 14A:
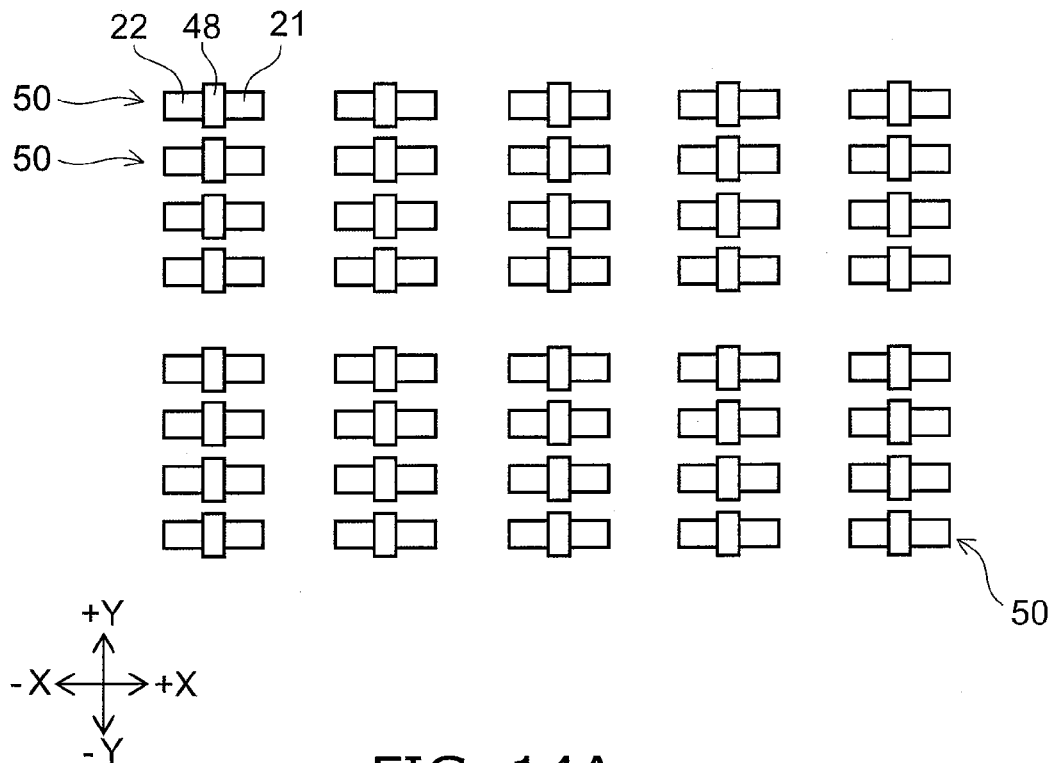
FIG. 14A is a plan view illustrating the method for manufacturing the photocoupler according to the first embodiment.
Figure 14B:
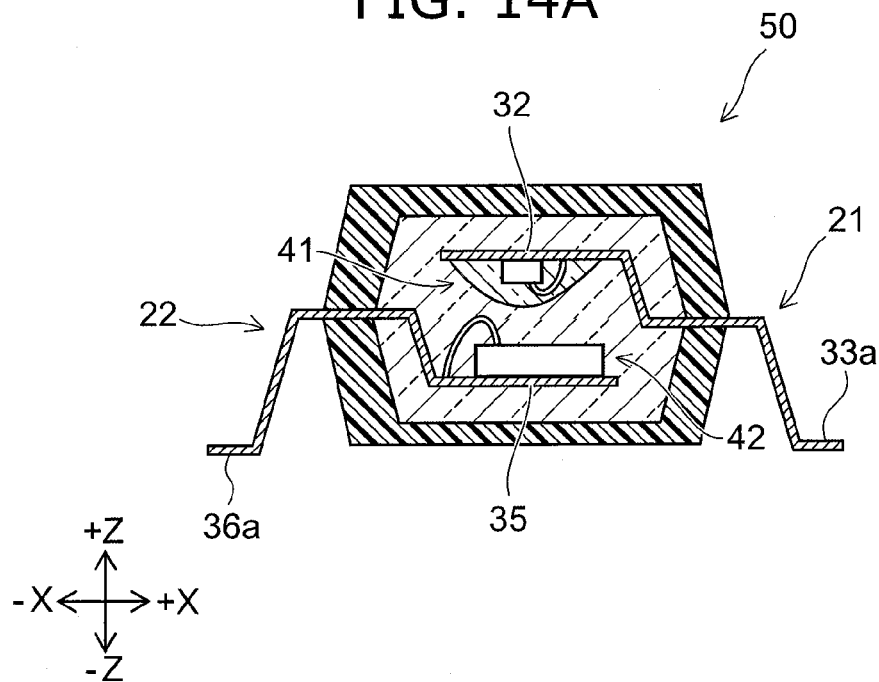
FIG. 14B is a partial sectional view thereof.

FIG. 14A is a plan view illustrating the method for manufacturing a photocoupler according to this embodiment. FIG. 14B is a partial sectional view thereof.

First, as shown in step S1 of FIG. 4 and FIGS. 5A and 5B, the aforementioned photocoupler lead frame sheet 1 is prepared. In FIGS. 5A to 14B, the photocoupler lead frame sheet 1 is shown in a simplified manner. The detailed configuration of the sheet 1 is as shown in FIGS. 1 to 3B.

On the other hand, a die 100 (see FIGS. 8A and 8B) is also prepared. The upper surface 100a of the die 100 is a surface larger than the sheet 1. Furthermore, on the upper surface 100a, a pilot pin 101 is provided at a position corresponding to the pilot hole 25 of the sheet 1, and a pilot pin 102 is provided at a position corresponding to the pilot hole 26. The pilot pins 101 and 102 stand perpendicular to the upper surface 100a. The diameter of the pilot pin 101 is slightly smaller than the inner diameter of the pilot hole 25. The diameter of the pilot pin 102 is slightly smaller than the inner diameter of the pilot hole 26.

Next, as shown in step S2 of FIG. 4 and FIGS. 6A and 6B, a light emitting device 41 is mounted on the light emitting side lead frame portion 21. Mounting the light emitting device 41 includes mechanically fixing the light emitting device 41 to the light emitting side lead frame portion 21 and electrically connecting both terminals of the light emitting device 41 to the light emitting device mounting portion 32 and the lead 31b. Specifically, the light emitting device 41 is bonded to the upper surface of the light emitting device mounting portion 32 using e.g. silver paste. Thus, the light emitting device 41 is fixed to the light emitting device mounting portion 32. Furthermore, one terminal of the light emitting device 41 is connected to the light emitting device mounting portion 32. Furthermore, the other terminal of the light emitting device 41 is connected to the lead 31b (see FIG. 2) via a wire. Then, by e.g. the potting method, the light emitting device 41 is covered with a transparent resin such as silicone resin. The light emitting device 41 is e.g. an LED (light emitting diode).

On the other hand, a light receiving device 42 is mounted on the light receiving side lead frame portion 22. Specifically, the light receiving device 42 is bonded to the upper surface of the light receiving device mounting portion 35 using e.g. silver paste. Thus, the light receiving device 42 is fixed to the light receiving device mounting portion 35. Furthermore, one terminal of the light receiving device 42 is connected to the light receiving device mounting portion 35. Furthermore, the other terminals of the light receiving device 42 are connected to the leads 33b and 33c (see FIG. 2) via wires. The light receiving device 42 is e.g. a photo IC. In this stage, the light emitting device 41 and the light receiving device 42 are placed on the upper side of the light emitting device mounting portion 32 and the light receiving device mounting portion 35, respectively.

Next, as shown in step S3 of FIG. 4 and FIG. 7, the light emitting column portion 11 is cut off from the linking portions 13 and 14. Thus, the light emitting column portion 11 is separated from the sheet 1. In the following, the rest of the sheet 1 from which all the light emitting column portions 11 have been cut off is referred to as sheet 1*a*.

Next, as shown in step S4 of FIG. 4 and FIGS. 8A and 8B, on the upper surface 100*a* of the die 100, the sheet is placed. At this time, in at least a subset (e.g., a plurality, such as four) of the pilot holes 26 of the sheet 1*a*, the pilot pins 102 of the die 100 are inserted. Thus, the sheet is positioned in the X direction and the Y direction with respect to the die 100. Furthermore, part of the lower surface of the sheet 1*a* is brought into abutment with the upper surface 100*a* of the die 100. Thus, the sheet 1*a* is positioned in the Z direction with respect to the die 100.

Next, as shown in step S5 of FIG. 4 and FIGS. 9A and 9B, each light emitting column portion 11 is rotated 180 degrees about the center axis C passing through the longitudinal (Y-direction) center portion of the light emitting column portion 11 and extending in the X direction. Thus, in each light emitting column portion 11, the positional relationship in the Y direction and the Z direction is inverted without changing the positional relationship in the X direction. That is, in the X direction, the light emitting side coupling bars 23*a*-23*c* and the light emitting device mounting portion 32 are left extending out to the −X direction, and the leads 33*a* and 33*b* are left extending out to the +X direction. On the other hand, in the Y direction, the light emitting side coupling bar 23*a* is placed on the −Y direction side, and the light emitting side coupling bar 23*c* is placed on the +Y direction side. In the Z direction, the light emitting device mounting portion 32 is located above the leads 33*a* and 33*c*, and the light emitting device 41 is located on the lower side of the light emitting device mounting portion 32. Furthermore, the light emitting side coupling bars 23*a*-23*c* are located above the leads 33*a*-33*c* by a half distance (t/2) of the thickness t of the sheet 1.

Next, as shown in step S6 of FIG. 4 and FIGS. 10A to 10C, the light emitting column portion 11 is placed on the die 100. Here, FIGS. 10A to 10C are drawn in mutually different scales. At this time, in the pilot holes 25 of each light emitting column portion 11, the pilot pins 101 of the die 100 are inserted. Thus, each light emitting column portion 11 is positioned in the X direction and the Y direction with respect to the die 100. Furthermore, the light emitting side coupling bars 23*a*, 23*b*, and 23*c* of each light emitting column portion 11 are brought into abutment with the light receiving side coupling bars 24*c*, 24*b*, and 24*a* of the sheet 1*a*, respectively. Thus, the light emitting column portion 11 is positioned in the Z direction with respect to the sheet 1*a*.

Thus, as shown in FIG. 10A, in the space of the sheet is where the light emitting column portion 11 has been cut off, the light emitting column portion 11 is placed again with the Z direction and the Y direction inverted. At this time, as shown in FIG. 10B, the light emitting devices 41 mounted on the light emitting column portion 11 and facing downward, and the light receiving devices 42 mounted on the light receiving column portion 12 and facing upward, are opposed to each other across a constant gap dimension G. Thus, the light emitting device 41 and the light receiving device 42 are coupled one to one.

Furthermore, as shown in FIG. 10C, the light emitting side coupling bar 23*a* of the light emitting column portion 11 is stacked in abutment on the light receiving side coupling bar 24*c* of the light receiving column portion 12. The light emitting side coupling bar 23*b* of the light emitting column portion 11 is stacked in abutment on the light receiving side coupling bar 24*b* of the light receiving column portion 12. The light emitting side coupling bar 23*c* of the light emitting column portion 11 is stacked in abutment on the light receiving side coupling bar 24*a* of the light receiving column portion 12. At this time, the light receiving side coupling bars 24*a*-24*c* are displaced downward by the distance t/2 from the leads 36*a*-36*c*. The light emitting side coupling bars 23*a*-23*c* are displaced upward by the distance t/2 from the leads 33*a* and 33*b*. Hence, in the Z direction, the position of the leads 33*a* and 33*b* and the position of the leads 36*a*-36*c* are made equal to each other and placed coplanarly.

Next, as shown in step S7 of FIG. 4 and FIGS. 11A and 11B, the light emitting side coupling bar 23*a* and the light receiving side coupling bar 24*c* thus stacked are connected to each other by e.g. resistance welding. Likewise, the light emitting side coupling bar 23*b* and the light receiving side coupling bar 24*b* are connected to each other. The light emitting side coupling bar 23*c* and the light receiving side coupling bar 24*a* are connected to each other. Thus, each light emitting column portion 11 is temporarily joined to the sheet 1*a*.

Next, as shown in step S8 of FIG. 4 and FIGS. 12A and 12B, a light transmissive resin such as a transparent resin is molded so as to cover a coupled pair of one light emitting device 41 and one light receiving device 42. Thus, an inner mold 46 is formed. Accordingly, the light emitting device 41 and the light receiving device 42 being coupled are optically connected. Furthermore, the light emitting side lead frame portion 21 and the light receiving side lead frame portion 22 supporting them are mechanically connected.

Next, as shown in step S9 of FIG. 4 and FIGS. 13A and 13B, a light shielding resin such as a black resin is molded so as to cover the inner mold 46. Thus, an outer mold 47 is formed. Accordingly, the optical path from the light emitting device 41 to the light receiving device 42 in the inner mold 46 is made optically independent. This can prevent disturbance light from being incident on the light receiving device 42. At this time, the tip portion of the leads 31*a* and 31*b* and the light emitting device mounting portion 32 in the light emitting side lead frame portion 21 are embedded inside the resin body 48 made of the inner mold 46 and the outer mold 47. The leads 33*a* and 33*b* are extracted outside the resin body 48. Likewise, the tip portion of the leads 34*a*-34*c* and the light receiving device mounting portion 35 in the light receiving side lead frame portion 22 are embedded inside the resin body 48. The leads 36*a*-36*c* are extracted outside the resin body 48.

Next, as shown in step S10 of FIG. 4 and FIGS. 14A and 14B, the light emitting side lead frame portion 21 is cut off from the light emitting column portion 11. The light receiving side lead frame portion 22 is cut off from the light receiving column portion 12. Thus, a unit including one light emitting side lead frame portion 21, one light receiving side lead frame portion 22, one light emitting device 41, one light receiving device 42, and one resin body 48 is singulated. Next, trimming and forming processing is performed on the leads 33*a* and 33*b* and the leads 36*a*-36*c* of each unit. Thus, the lead 33*a* and the lead 33*b* are separated from each other, and the leads 36*a*-36*c* are separated from each other. Furthermore, these leads are bent in a prescribed shape. Thus, a photocoupler 50 is manufactured.

Next, the operation and effect of this embodiment are described.

In this embodiment, pilot holes 26 are formed in the sheet 1*a*, i.e., the portion of the sheet 1 except the light emitting column portions 11. In the step shown in FIGS. 8A and 8B, when the sheet is placed on the die 100, the pilot pins 102 of the die 100 are inserted into the pilot holes 26. Thus, in the X direction and the Y direction, the sheet is can be accurately positioned with respect to the die 100.

Furthermore, pilot holes 25 are formed in each light emitting column portion 11. In the step shown in FIGS. 10A to 10C, when the light emitting column portion 11 is placed on the die 100, the pilot pins 101 of the die 100 are inserted into the pilot holes 25. Thus, in the X direction and the Y direction, the light emitting column portion 11 can be accurately positioned with respect to the die 100. As a result, in the X direction and the Y direction, the light emitting column portion 11 can be accurately positioned with respect to the sheet 1a. This can reduce variation in the positional relationship between the light emitting device 41 and the light receiving device 42.

In the following, this effect is demonstrated by a test example.

In this test example, several photocouplers 50 were manufactured using pilot holes, and several photocouplers were manufactured without using pilot holes. Then, the relative position of the light emitting device with respect to the light receiving device was measured. The standard deviation a and the process capability index Cpk of the measurement values were calculated. The result is shown in TABLE 1 and FIGS. 15A and 15B.

Figure 15A:
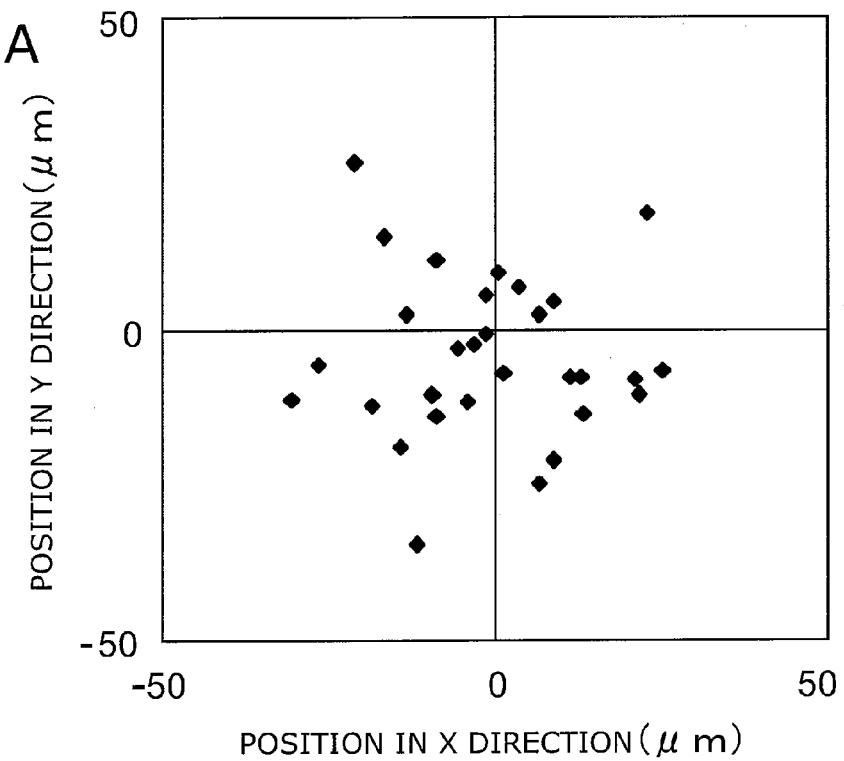
FIGS. 15A and 15B are graphs illustrating variation in a relative position of the light emitting device with respect to a light receiving device.
Figure 15B:
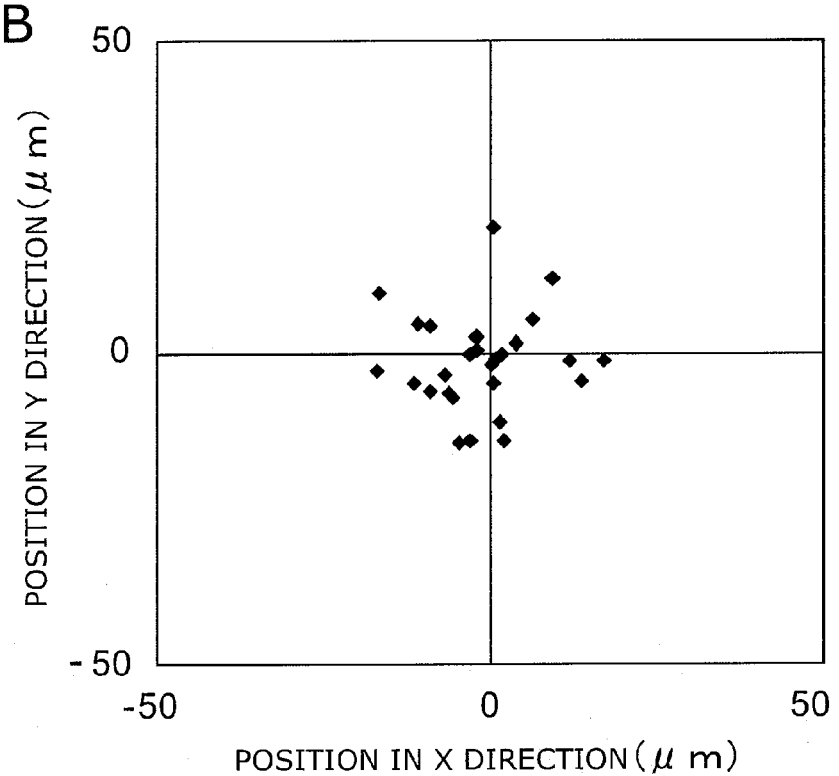

FIGS. 15A and 15B are graphs illustrating variation in the relative position of the light emitting device with respect to the light receiving device. The horizontal axis represents position in the X direction. The vertical axis represents position in the Y direction. FIG. 15A shows the case of not using pilot holes. FIG. 15B shows the case of using pilot holes.

TABLE 1

|  | Pilot holes | | | |
| --- | --- | --- | --- | --- |
|  | Not used | | Used | |
|  | X direction | Y direction | X direction | Y direction |
| Standard deviation σ (μm) | 14.49 | 15.25 | 8.45 | 7.67 |
| Process capability index Cpk | 1.13 | 1.00 | 1.92 | 2.09 |

As shown in TABLE 1 and FIG. 15A, in the case of not using pilot holes, the standard deviation σ of the relative position of the light emitting device with respect to the light receiving device was approximately 15 μm. In contrast, as shown in TABLE 1 and FIG. 15B, in the case of using pilot holes, the standard deviation a was approximately 8 μm. Hence, by using pilot holes, the positioning accuracy was improved as compared with the case of not using pilot holes.

Furthermore, according to this embodiment, each light emitting column portion 11 is provided with light emitting side coupling bars 23a-23c. Each light receiving column portion 12 is provided with light receiving side coupling bars 24a-24c. These are brought into abutment and connected to each other. Thus, in the Z direction, the light emitting column portion 11 can be accurately positioned with respect to the sheet 1a. Furthermore, each of the light emitting column portion 11 and the light receiving column portion 12 is thus provided with three coupling bars. Hence, even in the case where the sheet thickness of the sheet 1 is thin, warpage of the light emitting column portion 11 is suppressed. Thus, the gap dimension between the light emitting device 41 and the light receiving device 42 can be accurately controlled. As a result, in the photocoupler 50, the signal transmission efficiency can be increased while ensuring insulation between the light emitting device 41 and the light receiving device 42.

In the following, this effect is demonstrated by a test example.

In this test example, photocouplers 50 were manufactured using a plurality of kinds of sheets different in thickness. Then, the gap dimension, i.e., the distance between the light emitting device and the light receiving device was measured. The standard deviation 6 and the process capability index Cpk of the measurement values were calculated. The result is shown in TABLE 2 and FIGS. 16A and 16B.

Figure 16A:
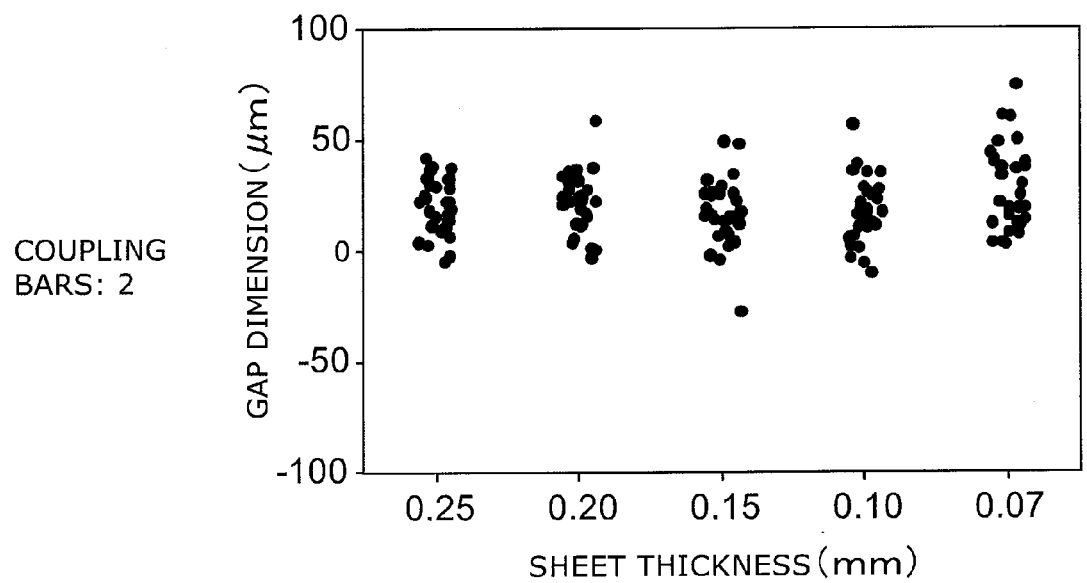
FIGS. 16A and 16B are graphs illustrating variation in a distance between the light emitting device and the light receiving device.
Figure 16B:
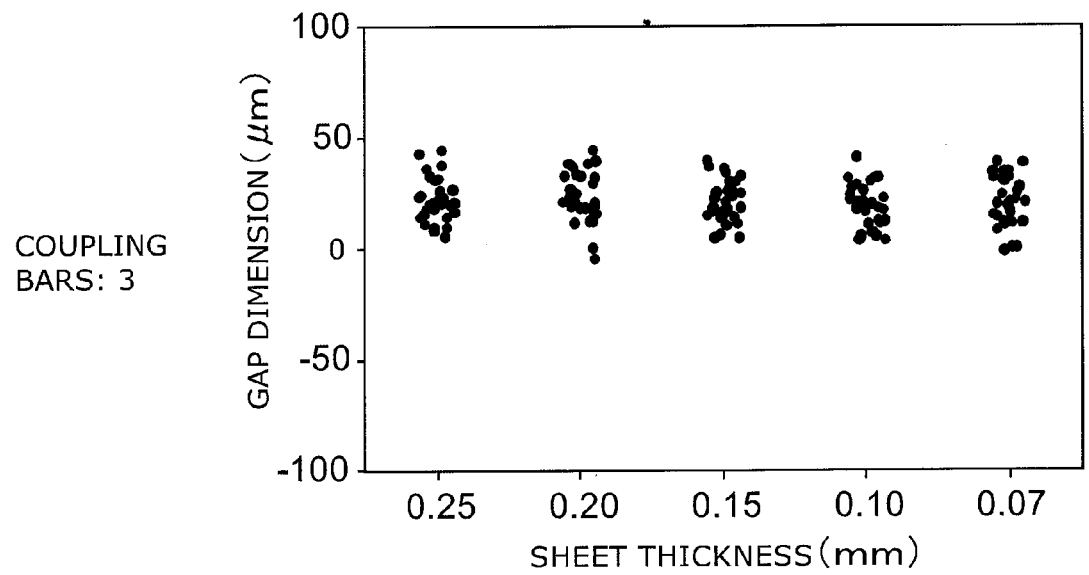

FIGS. 16A and 16B are graphs illustrating variation in the distance between the light emitting device and the light receiving device. The horizontal axis represents the thickness of the sheet. The vertical axis represents the gap dimension. FIG. 16A shows the case where each column portion is provided with two coupling bars. FIG. 16B shows the case where each column portion is provided with three coupling bars.

TABLE 2

| Sheet thickness (mm) | 0.25 | 0.20 | 0.15 | 0.10 | 0.07 |
| --- | --- | --- | --- | --- | --- |
|  | Coupling bars: 2 | | | | |
| Standard deviation σ (μm) | 12.4 | 14.1 | 15.4 | 14.9 | 19.1 |
| Process capability index Cpk | 2.72 | 2.04 | 1.93 | 1.77 | 1.24 |
|  | Coupling bars: 3 | | | | |
| Standard deviation σ (μm) | 9.9 | 11.4 | 9.6 | 9.6 | 11.8 |
| Process capability index Cpk | 2.37 | 2.09 | 2.84 | 2.61 | 2.33 |

As shown in TABLE 2 and FIGS. 16A and 16B, by providing three coupling bars in each light emitting column portion 11, variation in gap dimension was suppressed as compared with the case of providing two coupling bars. In particular, in the case of the thickness of the sheet 1 being as thin as 0.07 mm, variation in gap dimension was large in the case of providing only two coupling bars. However, when three coupling bars were provided, variation was effectively suppressed.

Furthermore, in this embodiment, of the three light emitting side coupling bars provided in each light emitting column portion 11, the light emitting side coupling bars 23a and 23c are placed in both longitudinal end portions of the light emitting column portion 11. On the other hand, the light emitting side coupling bar 23b is placed in the longitudinal center portion of the light emitting column portion 11. This can effectively suppress the warpage of the light emitting column portion 11, and increase the accuracy of the gap dimension.

Moreover, in this embodiment, in the sheet 1 before cutting off the light emitting column portions 11, the light emitting side coupling bars 23a-23c and the light receiving side coupling bars 24a-24c are displaced to the same side in the thickness direction of the sheet 1, such as downward, by a half distance (t/2) of the thickness t of the sheet 1 from the leads 33a and 33b and the leads 36a-36c. Thus, in the step shown in FIGS. 9A and 9B, when the light emitting column portion 11 is rotated 180 degrees about the center axis C, the light emitting side coupling bars 23a-23c are displaced upward from the leads 33a and 33b. As a result, in the step shown in FIGS. 10A to 10C, when the light emitting side coupling bars 23a-23c are stacked on the light receiving side coupling bars 24a-24c, the leads 33a and 33b and the leads 36a-36c are placed coplanarly. Thus, in the completed photocoupler 50, the leads on the light emitting side and the light receiving side can be caused to extend coplanarly.

Next, a second embodiment is described.

Figure 17:
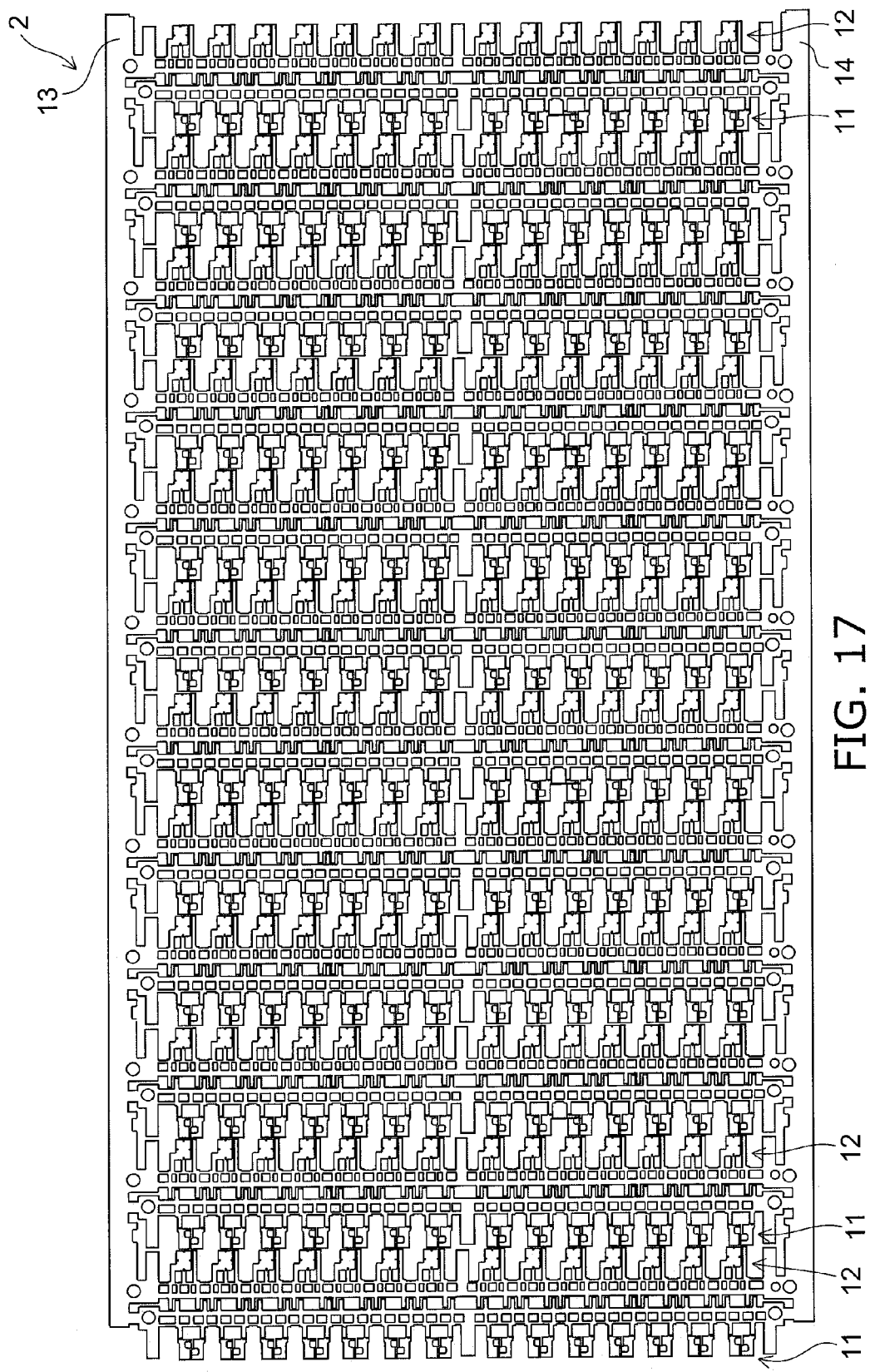
FIG. 17 is a plan view illustrating a photocoupler lead frame sheet according to a second embodiment.

FIG. 17 is a plan view illustrating the photocoupler lead frame sheet according to this embodiment.

Figure 18:
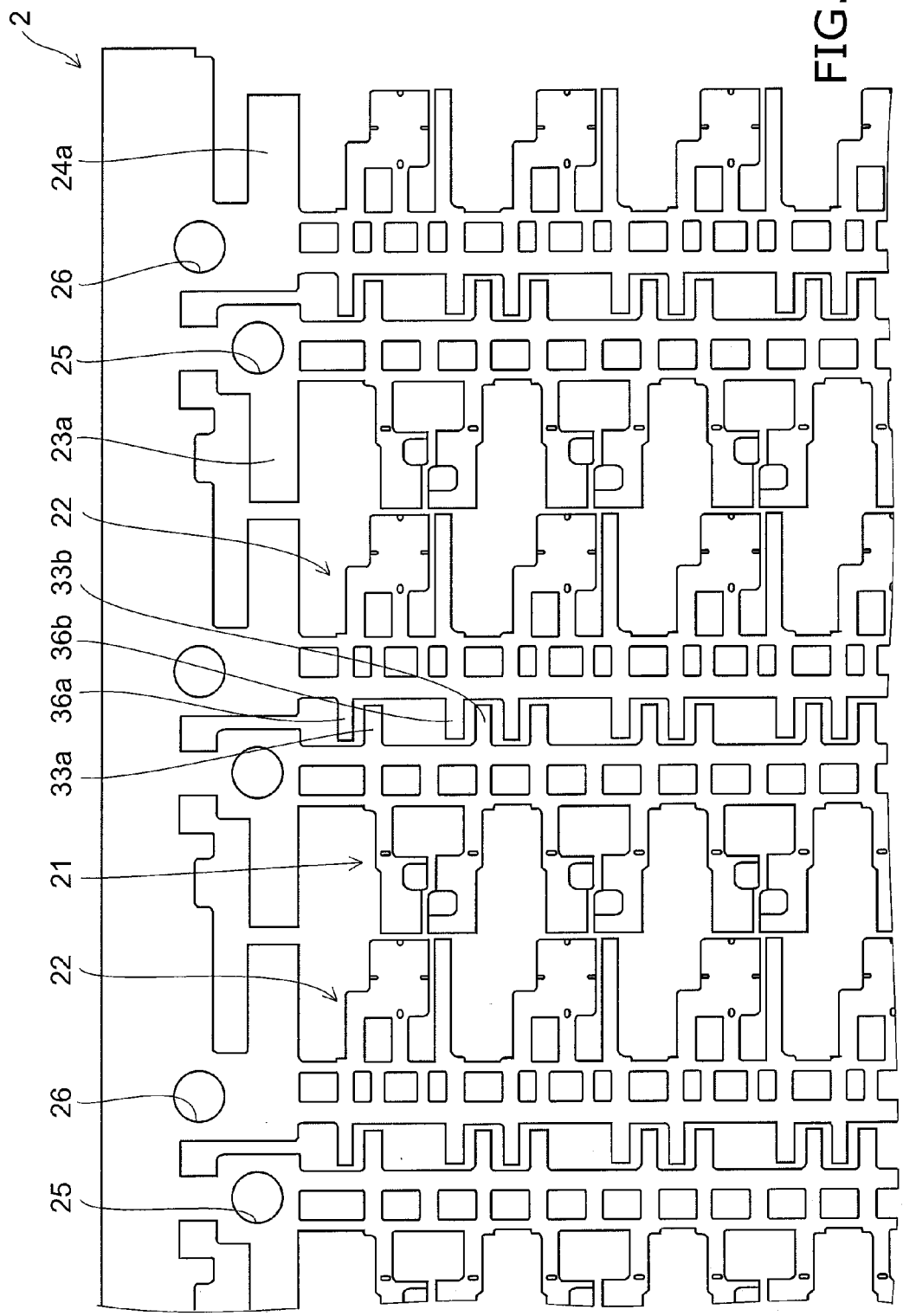
FIG. 18 is an enlarged view of FIG. 17.

FIG. 18 is an enlarged view of FIG. 17.

As shown in FIGS. 17 and 18, in the photocoupler lead frame sheet 2 according to this embodiment, the arrangement pitch of the light emitting side lead frame portions 21 along the Y direction in all the light emitting column portions 11 and the arrangement pitch of the light receiving side lead frame portions 22 along the Y direction in all the light receiving column portions 12 are equal to each other. However, the phase of the arrangement of the light emitting side lead frame portions 21 in the light emitting column portion 11 and the phase of the arrangement of the light receiving side lead frame portions 22 in the light receiving column portion 12 are different from each other. On the other hand, between the different light emitting column portions 11, the phases of the light emitting side lead frame portions 21 are equal to each other. Between the different light receiving column portions 12, the phases of the light receiving side lead frame portions 22 are equal to each other. Thus, the light emitting side lead frame portions 21 and the light receiving side lead frame portions 22 are arranged in a staggered configuration.

Furthermore, in the sheet 2, the light receiving side lead frame portion 22 is provided with only two leads 36a and 36b. The leads 33a and 33b of the light emitting side lead frame portion 21 and the leads 36a and 36b of the light receiving side lead frame portion 22 are arranged in a meshed manner. That is, the leads 33a and 33b and the leads 36a and 36b are spaced in the Y direction and partly overlap in the X direction.

According to this embodiment, the leads 33a and 33b of the light emitting side lead frame portion 21 and the leads 36a and 36b of the light receiving side lead frame portion 22 are arranged in a meshed manner. This can increase the arrangement density of the light emitting column portions 11 and the light receiving column portions 12 in the sheet 2. Thus, the utilization efficiency of the material in the sheet 2 can be increased, and the manufacturing cost of the photocoupler 50 can be reduced. The configuration of the sheet, the method for manufacturing a photocoupler, and the operation and effect of this embodiment other than foregoing are similar to those of the above first embodiment.

In the example illustrated in the above first and second embodiments, the light emitting column portion 11 and the light receiving column portion 12 are each provided with three coupling bars. However, the embodiments are not limited thereto as long as three or more coupling bars are provided. Also in the case where each column portion is provided with four or more coupling bars, in the Y direction, two coupling bars are preferably placed in both end portions of the column portion. Furthermore, the coupling bars are preferably arranged at equal spacings.

In the example illustrated in the above first embodiment, in the step shown in FIGS. 7A and 7B, the light emitting column portions 11 are cut off from the sheet 1. However, the embodiment is not limited thereto. Alternatively, the light receiving column portions 12 may be cut off from the sheet 1. In this case, the light emitting column portions 11 are left in the sheet 1a and opposed to the inverted light receiving column portions 12.

Furthermore, in the example illustrated in the above first embodiment, in the step shown in FIGS. 7A and 7B, the light emitting column portions 11 are cut off from the sheet 1. Then, in the step shown in FIGS. 8A and 8B, the sheet 1a is fixed to the die 100. However, the light emitting column portions 11 may be cut off from the sheet 1 after the sheet 1 is positioned with respect to the die 100.

The embodiments described above can realize a method for manufacturing a photocoupler and a photocoupler lead frame sheet capable of accurately positioning light emitting side lead frames and light receiving side lead frames.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A method for manufacturing a photocoupler, comprising:

mounting light emitting devices and light receiving devices on a lead frame sheet including:
  a plurality of light emitting column portions and a plurality of light receiving column portions that extend in a first direction and are alternately arranged along a second direction that is substantially perpendicular to the first direction, each light emitting column portion including:
    a plurality of light emitting side lead frame portions arranged along the first direction between a first end and a second end of the light emitting column portion,
    a first light emitting side coupling bar disposed at the first end of the light emitting column portion;
    a second light emitting side coupling bar disposed at the second end of the light emitting column portion; and
    a third light emitting side coupling bar disposed between the first and second ends of the light emitting column portion
  each light receiving column portion including:
    a plurality of light receiving side lead frame portions arranged along the first direction between a first end and a second end of the light receiving column portion;
    a first light receiving side coupling bar disposed at the first end of the light receiving column portion;
    a second light receiving side coupling bar disposed at the second end of the light receiving column portion; and
    a third light receiving side coupling bar disposed between the first and second ends of the light receiving column portion,
  a first linking portion extending in the second direction and linking the first ends of the light emitting column portions and the first ends of the light receiving column portions, the first linking portion disposed on a first outer edge of the plurality of light emitting column portions and light receiving column portions,
  a first pilot hole formed in at least one of the light emitting column portions or the light receiving column portions, a second pilot hole formed in a portion that is not in any of the light emitting column portions and the light receiving column portions, each light emitting device being mounted on a light emitting side lead frame portion, and each light receiving device being mounted on a light receiving side lead frame portion;

positioning the lead frame sheet with respect to a die by cutting off a first set of column portions from the linking portion and inserting a first pilot pin on the die into the second pilot hole;

positioning the first set of column portions with respect to the die such that the light emitting devices and the light receiving devices are in a facing arrangement with each other by inserting a second pilot pin formed on the die into the first pilot hole and stacking the light emitting side coupling bars and the light receiving side coupling bars;

connecting the light emitting side coupling bars and the light receiving side coupling bars to each other on the die;

forming a resin body so as to cover a pair of the light emitting device and the light receiving device; and cutting off the light emitting side lead frame portion from the light emitting column portion and cutting off the light receiving side lead frame portion from the light receiving column portion.

2. The method according to claim 1, wherein
the light emitting side coupling bars in each light emitting column portion are arranged at equal spacings along the first direction, and
the light receiving side coupling bars in each light receiving column portion are arranged at equal spacings along the first direction.

3. The method according to claim 1, wherein
the light emitting side lead frame portion is provided with a light emitting device mounting portion with the light emitting device mounted thereon, and a light emitting side lead connected to the light emitting device mounting portion and extracted outside the resin body,
the light receiving side lead frame portion is provided with a light receiving device mounting portion with the light receiving device mounted thereon, and a light receiving side lead connected to the light receiving device mounting portion and extracted outside the resin body,
the light emitting side lead and the light receiving side lead are disposed in the same plane, and
the light emitting device mounting portion and the light receiving device mounting portion are displaced in a thickness direction orthogonal to the first and second directions.

4. The method according to claim 3, wherein the light emitting side coupling bars and the light receiving side coupling bars are displaced in the thickness direction by a distance that is one-half of a thickness, measured in the thickness direction, of the light emitting side lead and the light receiving side lead.

5. The method according to claim 1, wherein a phase of the light emitting side lead frame portions in the light emitting column portion is not the same as a phase of the light receiving side lead frame portions in the light receiving column portion are different from each other.

6. The method according to claim 1, wherein the second pilot hole is in the first linking portion.

7. The method according to claim 1, wherein the lead frame sheet further includes:

a fourth light emitting side coupling bar disposed between the first and second ends of the light emitting column portion; and
a fourth light receiving side coupling bard disposed between the first and second ends of the light receiving column portion.

8. The method according to claim 1, wherein the lead frame sheet further includes:
a second linking portion extending in the second direction and linking the second ends of the light emitting column portions and the light receiving column portions, the second linking portion disposed on a second outer edge of the plurality of light emitting column portions and light receiving column portions that is spaced from the first outer edge in the first direction.

9. A photocoupler lead frame sheet, comprising:
a plurality of light emitting column portions and light receiving column portions extending in a first direction and arranged alternately along a second direction that is substantially perpendicular to the first direction,
each light emitting column portion including:
a plurality of light emitting side lead frame portions arranged along the first direction between a first end and a second end of the light emitting column portion;
a first light emitting side coupling bar disposed at the first end of the light emitting column portion;
a second light emitting side coupling bar disposed at the second end of the light emitting column portion; and
a third light emitting side coupling bar disposed between the first and second ends of the light emitting column portion,
each light receiving column portion including:
a plurality of light receiving side lead frame portions arranged along the first direction between a first end and a second end of the light receiving column portion
a first light receiving side coupling bar disposed at the first end of the light receiving column portion;
a second light receiving side coupling bar disposed at the second end of the light receiving column portion; and
a third light receiving side coupling bar disposed between the first and second ends of the light receiving column portion;
a first linking portion extending in the second direction and linking first ends of the light emitting column portions and the first ends of the light receiving column portions, the first linking portion disposed on a first outer edge of the plurality of light emitting column portions and light receiving column portions;
a first pilot hole being formed in at least one of the light emitting column portions or the light receiving column portions; and
a second pilot hole being formed in a portion that is not in any of the light emitting column portions and the light receiving column portions.

10. The sheet according to claim 9, wherein
the light emitting side coupling bars in each light emitting column portion are arranged at equal spacings along the first direction, and
the light receiving side coupling bars in each light receiving column portion are arranged at equal spacings along the first direction.

11. The sheet according to claim 9, wherein
the light emitting side lead frame portion includes:
a light emitting device mounting portion with a light emitting device mounted thereon; and
a light emitting side lead connected to the light emitting device mounting portion, the light receiving side lead frame portion includes:
- a light receiving device mounting portion with a light receiving device mounted thereon; and
- a light receiving side lead connected to the light receiving device mounting portion, the light emitting side lead and the light receiving side lead are disposed in a same plane, and the light emitting device mounting portion and the light receiving device mounting portion are displaced in a thickness direction orthogonal to the first and second directions.

12. The sheet according to claim 11, wherein the light emitting side coupling bars and the light receiving side coupling bars are displaced in the thickness direction by a distance that is one-half of a thickness, measured in the thickness direction, of the light emitting side lead and the light receiving side lead.

13. The sheet according to claim 9, further comprising:
a second linking portion extending in the second direction and linking the second ends of the light emitting column portions and the light receiving column portions, the second linking portion disposed on a second outer edge of the plurality of light emitting column portions and light receiving column portions that is spaced from the first outer edge in the first direction.

14. The sheet according to claim 9, wherein a phase of the light emitting side lead frame portions in each light emitting column portion is not the same as a phase of the light receiving side lead frame portions in each light receiving column portion.

15. The sheet according to claim 9, wherein the second pilot hole is in the first linking portion.

16. The sheet according to claim 9, further comprising:
- a fourth light emitting side coupling bar disposed between the first and second ends of the light emitting column portion; and
- a fourth light receiving side coupling bard disposed between the first and second ends of the light receiving column portion.

17. The sheet according to claim 9, wherein the number of light emitting side lead frame portions between the first and third light emitting side coupling bars is equal to the number of light emitting side lead frame portions between the second and third light emitting side coupling bars.

* * * * *